(12) United States Patent
Sugimoto et al.

(10) Patent No.: US 6,550,988 B2
(45) Date of Patent: Apr. 22, 2003

(54) SUBSTRATE PROCESSING APPARATUS

(75) Inventors: Hiroaki Sugimoto, Kyoto (JP); Seiichiro Okuda, Kyoto (JP); Takuya Kuroda, Kyoto (JP)

(73) Assignee: Dainippon Screen Mfg., Co., Ltd., Kyoto (JP)

( * ) Notice: Subject to any disclaimer, the term of this patent is extended or adjusted under 35 U.S.C. 154(b) by 0 days.

(21) Appl. No.: 09/984,533

(22) Filed: Oct. 30, 2001

(65) Prior Publication Data

US 2002/0051644 A1 May 2, 2002

(30) Foreign Application Priority Data

Oct. 30, 2000 (JP) .................................. 2000-329812
Oct. 30, 2000 (JP) .................................. 2000-329813
Jun. 5, 2001 (JP) .................................. 2001-169361

(51) Int. Cl.[7] .................................. G03D 5/00
(52) U.S. Cl. .................. 396/564; 396/611; 396/627; 134/902; 15/77
(58) Field of Search ................. 396/611, 626; 134/1, 3, 32, 33, 198, 153, 157, 902; 118/52, 319–321; 15/77

(56) References Cited

U.S. PATENT DOCUMENTS

| | | | |
|---|---|---|---|
| 5,985,039 A | * 11/1999 | Yonemizu et al. | 134/902 |
| 6,334,902 B1 | * 1/2002 | Mertens et al. | 134/1 |
| 2002/0035762 A1 | * 3/2002 | Okuda et al. | 134/902 |
| 2002/0092542 A1 | * 7/2002 | Park et al. | 134/1.3 |

FOREIGN PATENT DOCUMENTS

JP 2000-223394 * 8/2000

\* cited by examiner

Primary Examiner—Della Rutledge
(74) Attorney, Agent, or Firm—McDermott, Will & Emery

(57) ABSTRACT

A removal liquid is supplied to a substrate on which a thin film formed is patterned by dry etching using a resist film as a mask, and cleaning is made with de-ionized water, thereby removing a reaction product generated on the surface of the substrate. After that, the processed substrate is heated, thereby completely drying the substrate from which the reaction product has been eliminated.

33 Claims, 14 Drawing Sheets

F I G. 1
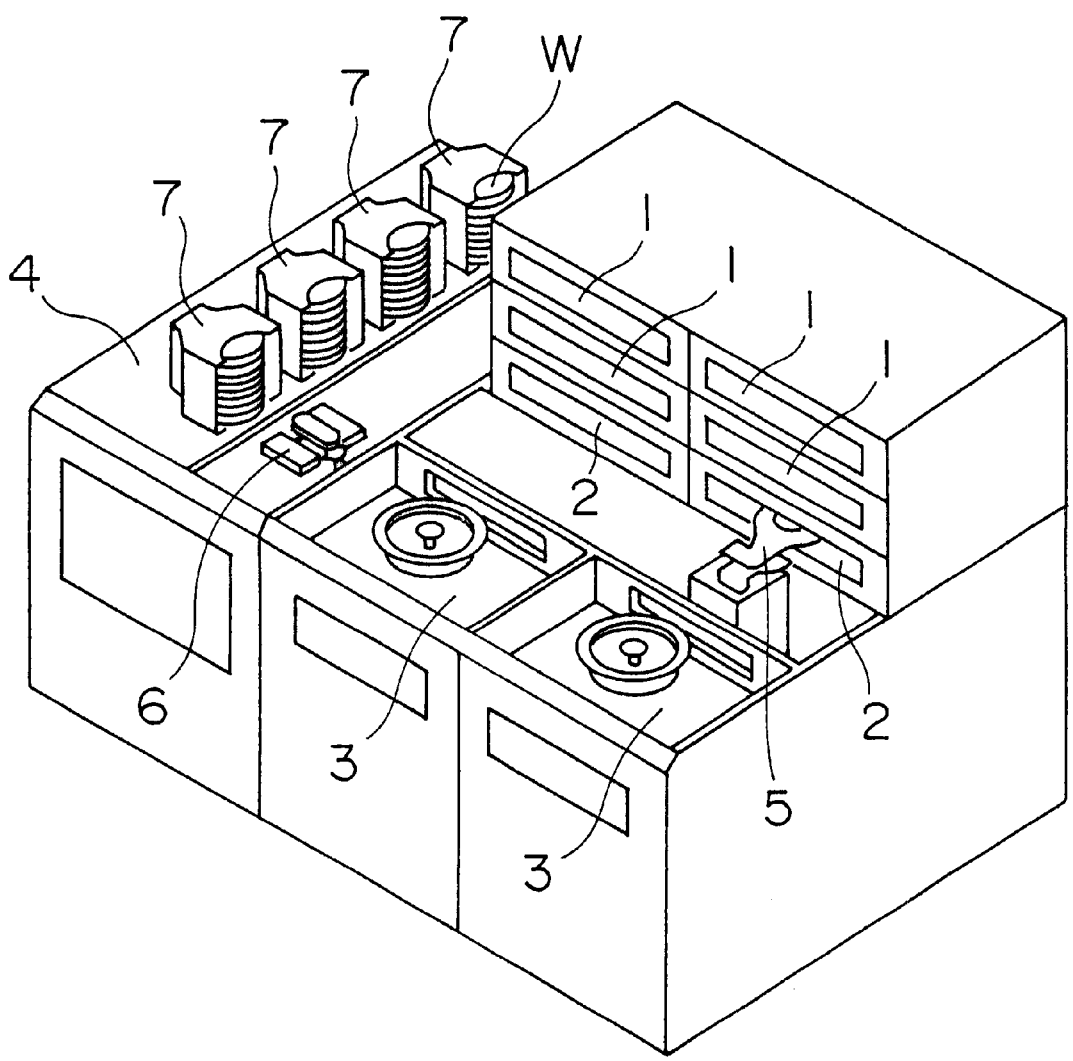

SUBSTRATE PROCESSING APPARATUS

BACKGROUND OF THE INVENTION

1. Field of the Invention

The present invention relates to a substrate processing method and a substrate processing apparatus for removing, by using a removal liquid, an organic matter on a substrate or a reaction product generated on the surface of a substrate on which a thin film formed is patterned by dry etching by using a resist film as a mask.

The invention also relates to a substrate processing apparatus for drying a substrate processed with de-ionized water and, more particularly, to a substrate processing apparatus for supplying a removal liquid for removing an organic matter on a substrate or a reaction product generated on a substrate on which a thin film formed is patterned by dry etching by using a resist film as a mask, further supplying de-ionized water to the substrate, and drying the substrate.

2. Description of the Background Art

Processes of manufacturing a semiconductor device include a process of forming interconnections of a semiconductor device by etching a thin film made of a metal such as aluminum or copper (metal film) formed on a substrate such as a semiconductor wafer by using a patterned resist film as a mask.

The etching process is executed by, for example, dry etching such as RIE (Reactive Ion Etching).

Since the power of reactive ions used for such dry etching is extremely strong, on completion of the etching on the metal film, the resist film also changes at a predetermined rate, a part of the resist film is converted to a reaction product such as a polymer, and the reaction product is deposited on side walls of the metal film. Since the reaction product is not removed by a following resist removing process, before or after executing the resist removing process, the reaction product has to be removed.

Conventionally, a reaction product removing process is therefore performed in such a manner that a reaction product deposited on the side walls of a metal film is removed by supplying a removal liquid having an action of removing the reaction production to the substrate after the dry etching process or resist removing process, after that, the substrate is cleaned with de-ionized water and, further, the de-ionized water is drained off so as to dry the substrate.

As a pattern is becoming finer in recent years, however, there is a case that de-ionized water on a substrate cannot be sufficiently removed only by the draining operation for drying. If de-ionized water remains on the substrate, it is feared that the remained de-ionized water reacts with a thin film, a component in the air, or a contaminant in the air and another contaminant is generated.

Therefore, when there is a process of supplying de-ionized water to a substrate, the substrate has to be dried with reliability.

Particularly, in the case where de-ionized water remains on a wafer W from which a reaction product has been removed, since a metal thin film is often formed on the surface of the substrate, a problem such that the metal reacts with de-ionized water in the air and an unnecessary oxide is generated arises. When the substrate is carried to a process performed under a vacuum condition such as CVD, the de-ionized water remained on the substrate exerts an adverse influence on the process.

Further, in association with reduction in size of a pattern, a change in pretreatment, and the like in recent years, the nature of a reaction product varies, and a problem such that longer time is required to remove the reaction production in the conventional reaction production removing process arises. Consequently, in recent years, a removal liquid having improved performance of removing a reaction product by being used at temperature higher than ordinary temperature has been developed. Even in the case of using such a removal liquid, there is a case that long time is required to remove a reaction product.

SUMMARY OF THE INVENTION

The present invention is directed to a substrate processing apparatus for removing an organic matter adhered on a substrate by a removal liquid of the organic matter.

According to the present invention, a substrate processing apparatus for removing an organic matter adhered to a substrate by a removal liquid of the organic matter, comprises: a rotary holding unit for holding the substrate so as to be rotatable; a removal liquid supplying mechanism for supplying the removal liquid toward a surface of the substrate held by the rotary holding unit; a de-ionized water supplying mechanism for supplying de-ionized water toward the surface of the substrate held by the rotary holding unit; and a heating unit for heating the substrate.

In this substrate processing apparatus, after a process of removing a reaction product, a substrate can be dried with reliability. Consequently, occurrence of a problem such that de-ionized water remains on a metal pattern on the substrate from which the reaction product has been removed and an oxide is generated, and occurrence of a problem such that when a substrate from which a reaction product has been removed is carried to a process performed under a vacuum condition, de-ionized water attached to the substrate exerts an adverse influence on the process can be effectively prevented.

Preferably, in the substrate processing apparatus, the heating unit heats the substrate before the removal liquid is supplied to the substrate by the removal liquid supplying mechanism.

In this substrate processing apparatus, decrease in the temperature of the removal liquid supplied to the substrate is prevented and the process of removing a reaction product can be completed in short time.

According to another aspect of the present invention, a substrate processing apparatus for removing an organic matter adhered to a substrate by a removal liquid of the organic matter, comprises: a substrate holding unit for holding the substrate; a removal liquid supplying mechanism for supplying the removal liquid toward the substrate held by the substrate holding unit; a de-ionized water supplying mechanism for supplying de-ionized water toward the substrate held by the substrate holding unit; a chamber for housing the substrate held by the substrate holding unit; and a pressure reducing unit for reducing pressure in the chamber.

In this substrate processing apparatus, the substrate can be dried with reliability.

According to still another aspect of the present invention, a substrate processing apparatus for removing an organic matter adhered to a substrate by a removal liquid of the organic matter, comprises: a substrate holding unit for holding the substrate; a removal liquid supplying mechanism for supplying the removal liquid toward the substrate held by the substrate holding unit; a de-ionized water supplying mechanism for supplying de-ionized water toward the substrate held by the substrate holding unit; a chamber for housing the substrate; a transporting unit for transporting the substrate held by the substrate holding unit to the chamber; and a pressure reducing unit for reducing pressure in the chamber.

In this substrate processing apparatus, the substrate can be dried with reliability.

An object of the invention is therefore to completely dry a substrate from which an organic matter has been removed by a removal liquid of the organic matter.

These and other objects, features, aspects, and advantages of the present invention will become more apparent from the following detailed description of the present invention when taken in conjunction with the accompanying drawings.

BRIEF DESCRIPTION OF THE DRAWINGS

FIG. 1 is a perspective view of a substrate processing apparatus according to the invention;

DESCRIPTION OF THE PREFERRED EMBODIMENTS

First Embodiment

Figure 2:
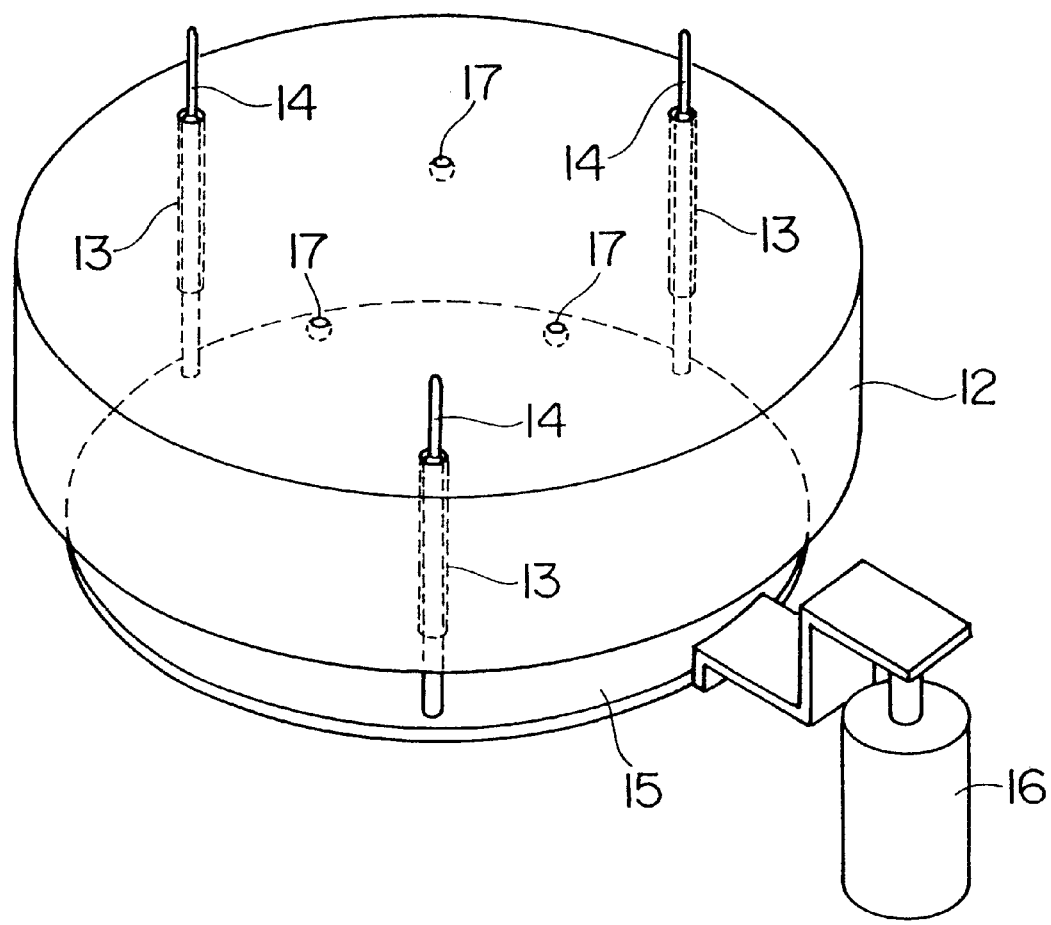
FIG. 2 is a perspective view of the main portion of a heating unit.

The configuration of a substrate processing apparatus according to a first preferred embodiment of the invention will now be described hereinbelow. The substrate processing apparatus is directed to remove a polymer as a reaction product from the surface of a semiconductor wafer made of silicon as a substrate on which a thin film is formed.

An example of the thin film is a metal film made of copper, aluminum, titanium, tungsten, or the like, or an insulating film such as a silicon oxide film or a silicon nitride film.

As a removal liquid used in the substrate processing apparatus, a liquid containing an organic alkaline liquid such as DMF (dimethylformamide), DMSO (dimethyl sulfoxide), or hidroxylamine, a liquid containing an inorganic acid such as fluorine or phosphoric acid, a liquid containing an ammonium fluoride substance, or the like can be used. Other removal liquids are liquids each containing 1-methyl-2-pyrolidone, tetrahydrothiophene-1.1-dioxide, isopropanolamine, monoethanolamine, 2-(2-aminoethoxye) ethanol, catechol, N-methylpyrolidone, aromatic diol, perflene, and phenole. More concretely, a mixed liquid of 1-methyl-2-pyrolidone, tetrahydrotiophene-1.1-dioxide, and isopropanol amine, a mixed liquid of dimethyl sulfoxide and monoethanolamine, a mixed liquid of 2-(2-aminoethoxye) ethanol, hydroxy amine, and catechol, a mixed liquid of 2-(2-aminoethoxye)ethanol and N-methylpyrolidone, a mixed liquid of monoethanolamine, water, and aromatic diol, a mixed liquid of perflene and phenol, and the like may be used.

First, a general configuration of the substrate processing apparatus will be described. FIG. 1 is a perspective view of the substrate processing apparatus according to the invention.

The substrate processing apparatus includes an indexer 4 for loading a cassette 7 housing a plurality of substrates W, four heating units 1 for heating substrates W, two cooling units 2 for cooling substrates W, two spin cleaning units 3 for cleaning wafer W with a removal liquid or the like, and a pair of transporting mechanisms 5 and 6 for transporting wafer W among cassette 7 mounted on indexer 4, heating unit 1, cooling unit 2, and spin cleaning unit 3.

Wafer W housed in cassette 7 and carried to the substrate processing apparatus is taken out from cassette 7 by transporting mechanism 6 and passed to transporting mechanism 5. Wafer W is pre-heated by heating unit 1 and, after that, a reaction product is removed by spin cleaning unit 3. Wafer W is heated to be dried by heating unit 1, cooled by cooling unit 2, passed from transporting mechanism 5 to transporting mechanism 6, and housed in cassette 7. Such an operation will be described in detail hereinlater.

The configuration of heating unit 1 will now be described. FIG. 2 is a perspective view showing the main portion of heating unit 1.

In the housing of heating unit 1, a heating plate 12 is disposed. Heating plate 12 has therein a plate-shaped heater. In heating plate 12, three through holes 13 are formed. Via through hole 13, three supporting pins 14 are disposed so as to be movable in the vertical direction.

Three supporting pins 14 are made of a refractory insulating material such as fluororesin, ceramics, or polyimide resin and are vertically provided on a supporting arm 15 in positions facing the periphery of the back face of wafer W to be supported. Supporting arm 15 is coupled to an air cylinder 16. By driving of air cylinder 16, the tip of supporting pin 14 moves vertically between a receiving position of wafer W where the tip is projected from the surface of heating plate 12 and a heating position of wafer W housed in through hole 13 in heating plate 12.

Three spheres 17 are embedded in the surface of heating plate 12. Spheres 17 are made of a low heat-transfer material such as alumina. Each sphere 17 is disposed so that its top is projected from the surface of heating plate 12 only by a small amount. In a state where a very small gap what is called a proximity gap is maintained between wafer W and the surface of heating plate 12, wafer W is placed and supported on spheres 17 of heating plate 12 and heated.

In the case of loading wafer W onto heating plate 12, supporting pins 14 are preliminarily raised to the substrate receiving portion by the driving of air cylinder 16. Wafer W is transported by transporting mechanism 5 shown in FIG. 1 and placed on supporting pins 14. By the driving of air cylinder 16, supporting pins 14 are lowered to the heating position.

When wafer W is placed on spheres 17 in heating plate 12 and the heat treatment is completed, by moving supporting pins 14 upward to the substrate receiving position, wafer W is separated from heating plate 12. When wafer W is raised from heating plate 12, wafer W is received from supporting pins 14 by transporting mechanism 5 shown in FIG. 1 and transported to a following process.

Cooling unit 2 shown in FIG. 1 has a configuration similar to that of heating unit 1. In cooling unit 2, however, in place of the heating plate having therein a plate-shaped heater, a cooling plate having therein a plate-shaped cooler using a Peltier device or the like is disposed so as to cool wafer W.

Figure 3:
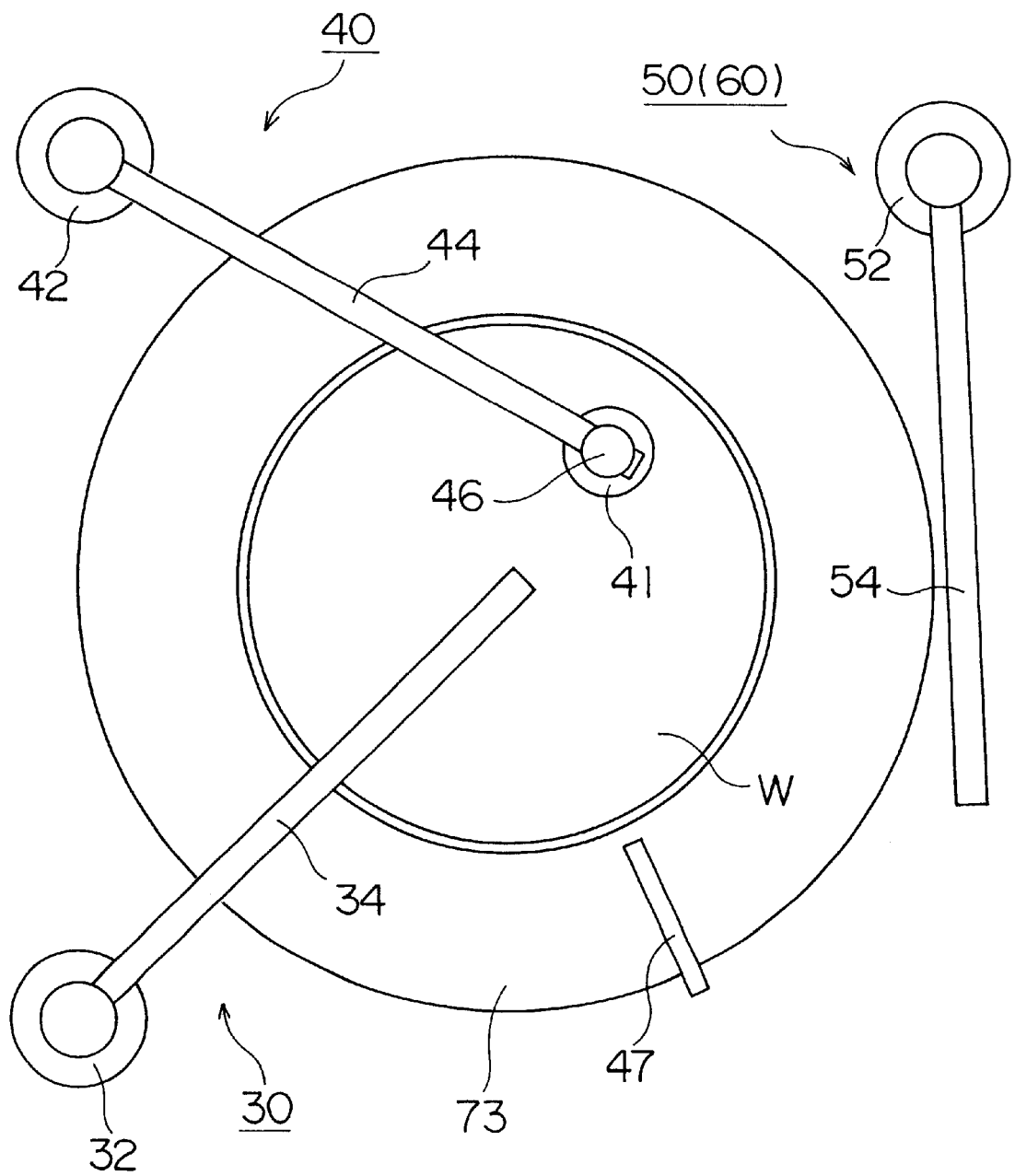
FIG. 3 is a schematic plan view of a spin cleaning unit.
Figure 4:
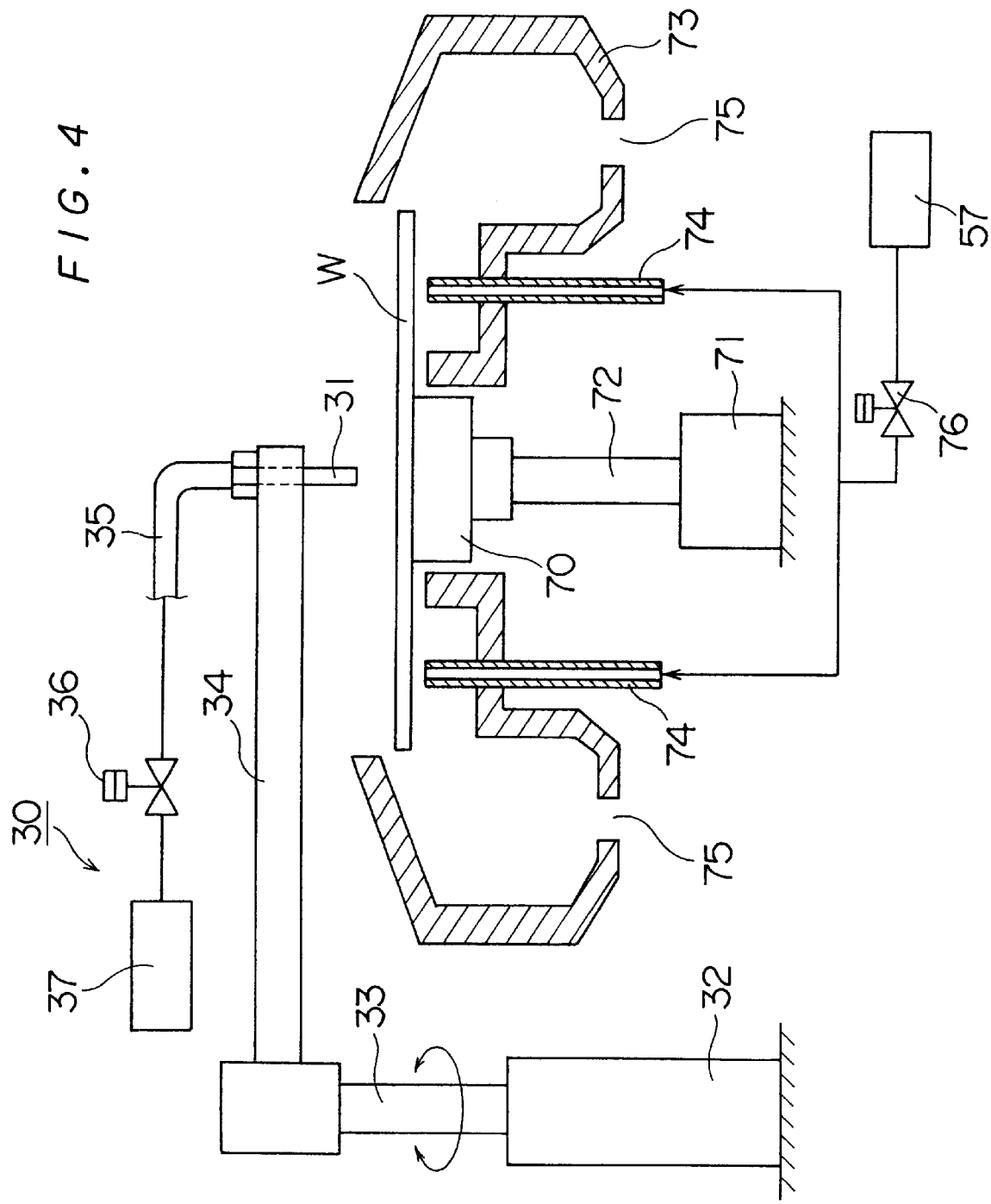
FIG. 4 is a schematic side view of spin cleaning unit.
Figure 5:
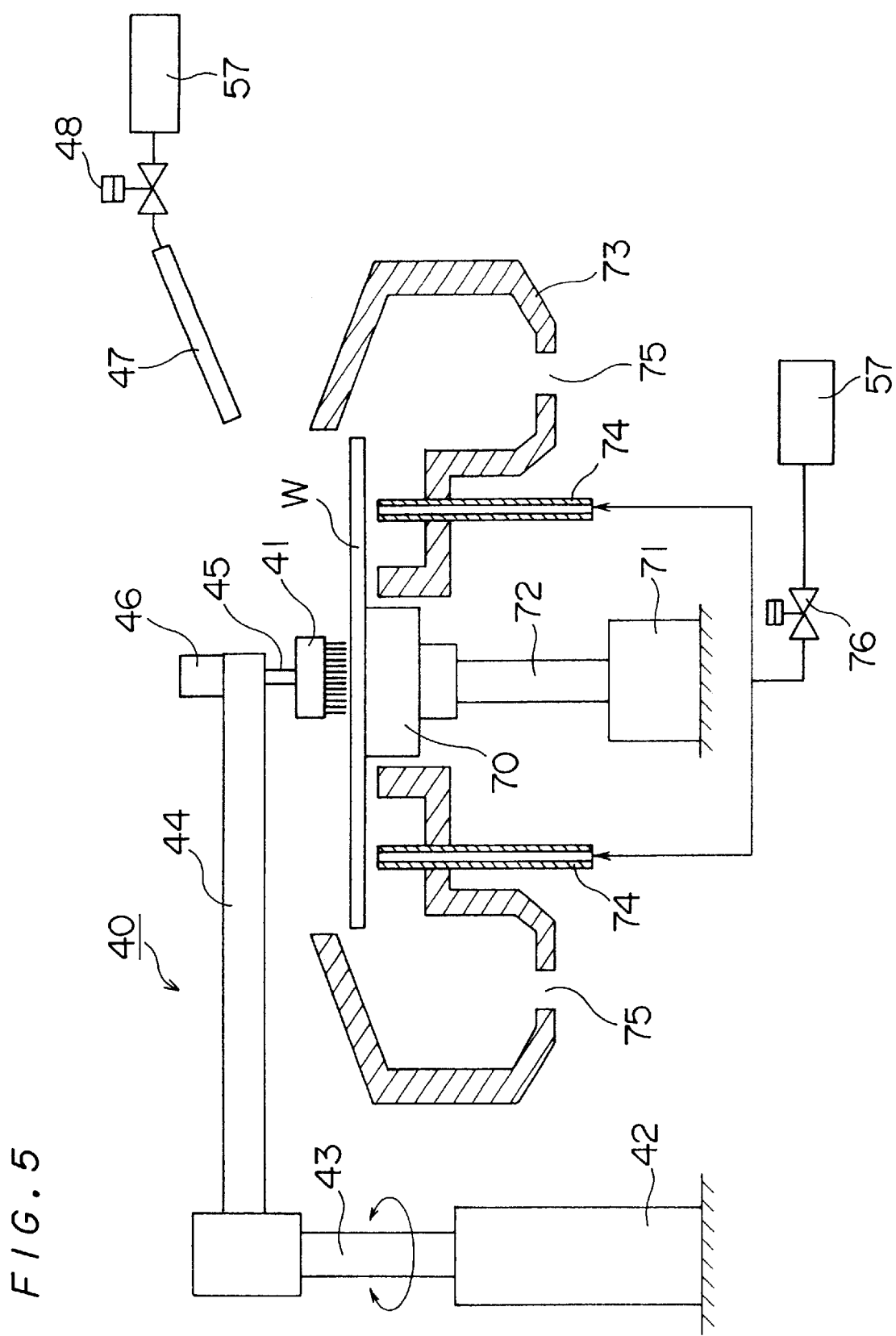
FIG. 5 is a schematic side view of spin cleaning unit.
Figure 6:
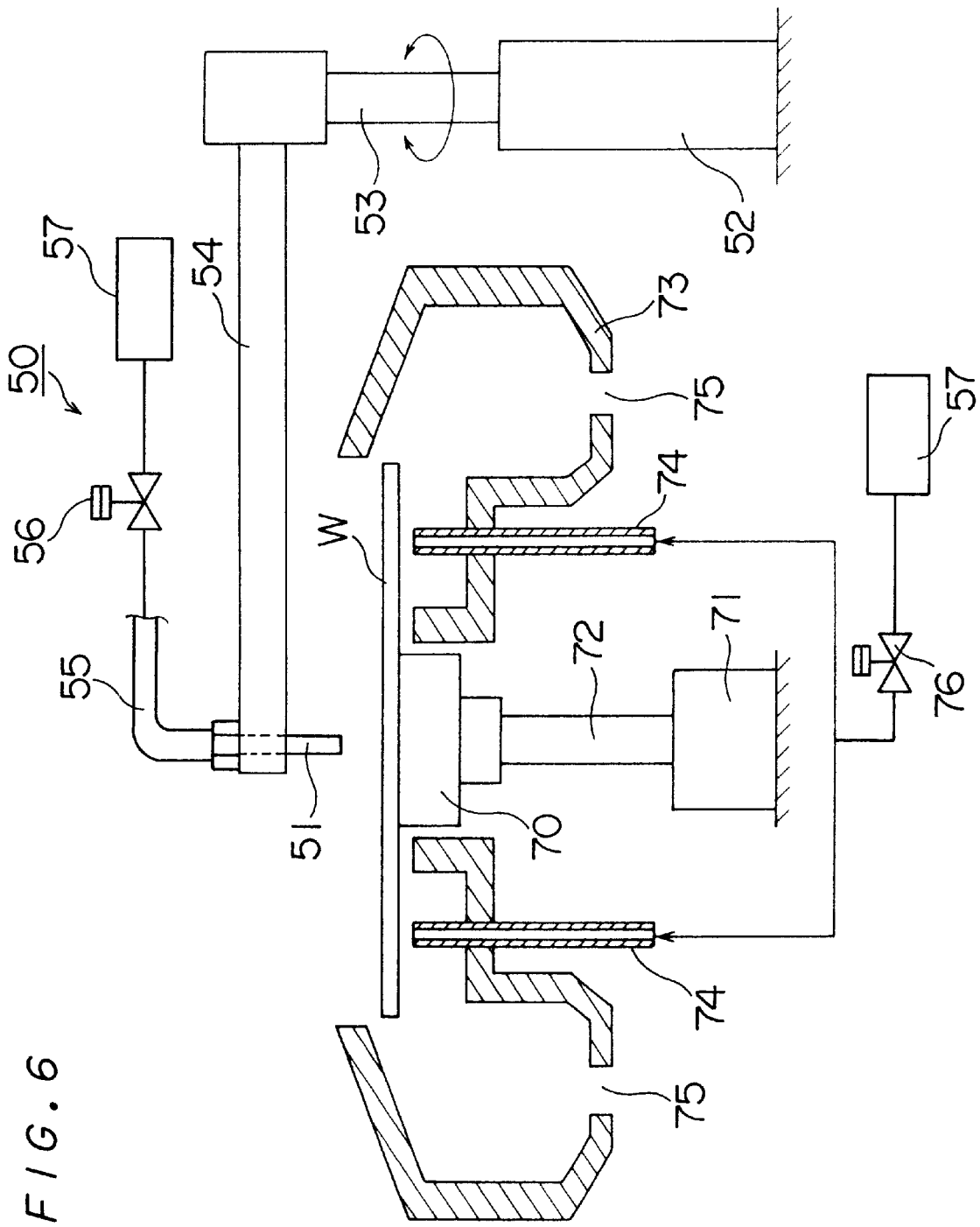
FIG. 6 is a schematic side view of spin cleaning unit.

The configuration of spin cleaning unit 3 will now be described. FIG. 3 is a schematic plan view of spin cleaning unit 3. Each of FIGS. 4 to 6 is a schematic side view of spin cleaning unit 3. FIG. 4 shows the relation of a removal liquid supplying mechanism 30, a spin chuck 70, and a cup 73 for preventing splash. FIG. 5 shows the relation of a brush cleaning mechanism 40, spin chuck 70, and cup 73 for preventing splash. FIG. 6 shows the relation of a de-ionized water supplying mechanism 50, spin chuck 70, and cup 73 for preventing splash. In the diagrams, the cross section of cup 73 for preventing splash, and a back face cleaning nozzle 74 is shown.

Spin cleaning unit 3 has spin chuck 70 for rotatably holding wafer W, a removal liquid supplying mechanism 30 for supplying removal liquid toward the surface of wafer W held by spin chuck 70, a brush cleaning mechanism 40 for cleaning the surface of wafer W held by spin chuck 70 with a rotary brush 41, and a de-ionized water supplying mechanism 50 for supplying de-ionized water toward the surface of wafer W held by spin chuck 70.

As shown in FIGS. 4 to 6, spin chuck 70 rotates around a spindle 72 extended in the vertical direction as a center by the driving of a motor 71 in a state where wafer W is attached to the top face of spin chuck 70. Wafer W therefore rotates with spin chuck 70 in a plane parallel to the principal face of spin chuck 70.

Around spin chuck 70, cup 73 for preventing splash is disposed. The cross section of cup 73 for preventing splash is an almost U shape. In plan view, cup 73 for preventing splash has an almost ring shape having an opening in the center portion. In the bottom of cup 73 for preventing splash, an opening 75 coupled to a not-illustrated drain is formed.

In a position facing the back face of wafer W in cup 73 for preventing splash, back-face cleaning nozzle 74 for cleaning the back face of the wafer W by supplying de-ionized water to the back face of wafer W is disposed. Back-face cleaning nozzle 74 is connected to a de-ionized water supply unit 57 via an electromagnetic valve 76. De-ionized water supply unit 57 can force-feed de-ionized water.

As shown in FIG. 4, removal liquid supplying mechanism 30 has a removal liquid discharge nozzle 31 for discharging a removal liquid toward wafer W. Removal liquid discharge nozzle 31 is disposed at the tip of an arm 34 swung around a shaft 33 extending vertically by the driving of a nozzle moving mechanism 32. Therefore, removal liquid discharge nozzle 31 can reciprocate between a position where removal liquid discharge nozzle 31 faces the center of rotation of wafer W held and rotated by spin chuck 70 and a position where nozzle 31 faces the periphery of wafer W. Nozzle moving mechanism 32 can move arm 34 also in the vertical direction.

Removal liquid discharge nozzle 31 is also connected to a removal liquid supply unit 37 via an electromagnetic valve 36. Removal liquid supply unit 37 can force-feed a removal liquid heated to a predetermined temperature. Reference numeral 35 denotes a tube for supplying the removal liquid.

Brush cleaning mechanism 40 has rotary brush 41 for cleaning the surface of wafer W as shown in FIG. 5. Rotary brush 41 is disposed at the tip of an arm 44 swung around a shaft 43 standing vertically as a center by the driving of a rotary brush moving mechanism 42. Rotary brush 41 can therefore reciprocate between a position where rotary brush 41 faces the center of rotation of wafer W held and rotated by spin chuck 70 and a position where the rotary brush 41 faces the periphery of wafer W. Rotary brush moving mechanism 42 can move arm 44 also in the vertical direction.

Rotary brush 41 rotates around a rotary shaft 45 extending in the vertical direction by the driving of a motor 46 disposed at the tip of arm 44. The lower end of rotary brush 41 can be disposed, as shown in FIG. 5, in a position where it comes into contact with the surface of wafer W held by spin chuck 70 or a position where it is apart from the surface of wafer W held by spin chuck 70 only a small gap. By reciprocating arm 44 between the position where rotary brush 41 faces the center of rotation of wafer W and the position where rotary brush 41 faces the periphery of wafer W in a state where rotary brush 41 is rotated in such positions, the entire surface of wafer W can be cleaned with rotary brush 41.

In a position opposite to brush cleaning mechanism 40, as shown in FIGS. 3 and 5, a de-ionized water jet nozzle 47 for supplying de-ionized water to the surface of wafer W at the time of cleaning wafer W with rotary brush 41 is disposed. De-ionized water jet nozzle 47 is connected to de-ionized water supply unit 57 via an electromagnetic valve 48.

De-ionized water supplying mechanism 50 has, as shown in FIG. 6, a de-ionized water discharge nozzle 51 for discharging de-ionized water toward wafer W. De-ionized water discharge nozzle 51 is disposed at the tip of an arm 54 swung around a shaft 53 extending in the vertical direction as a center by the driving of a nozzle moving mechanism 52. Consequently, de-ionized water discharge nozzle 51 can reciprocate between a position where it faces the center of rotation of wafer W held and rotated by spin chuck 70 and a position where it faces the periphery of wafer W. Nozzle moving mechanism 52 can also move arm 54 in the vertical direction.

De-ionized water discharge nozzle 51 is connected to de-ionized water supply unit 57 via an electromagnetic valve 56. Reference numeral 55 denotes a tube for supplying de-ionized water.

Figure 7:
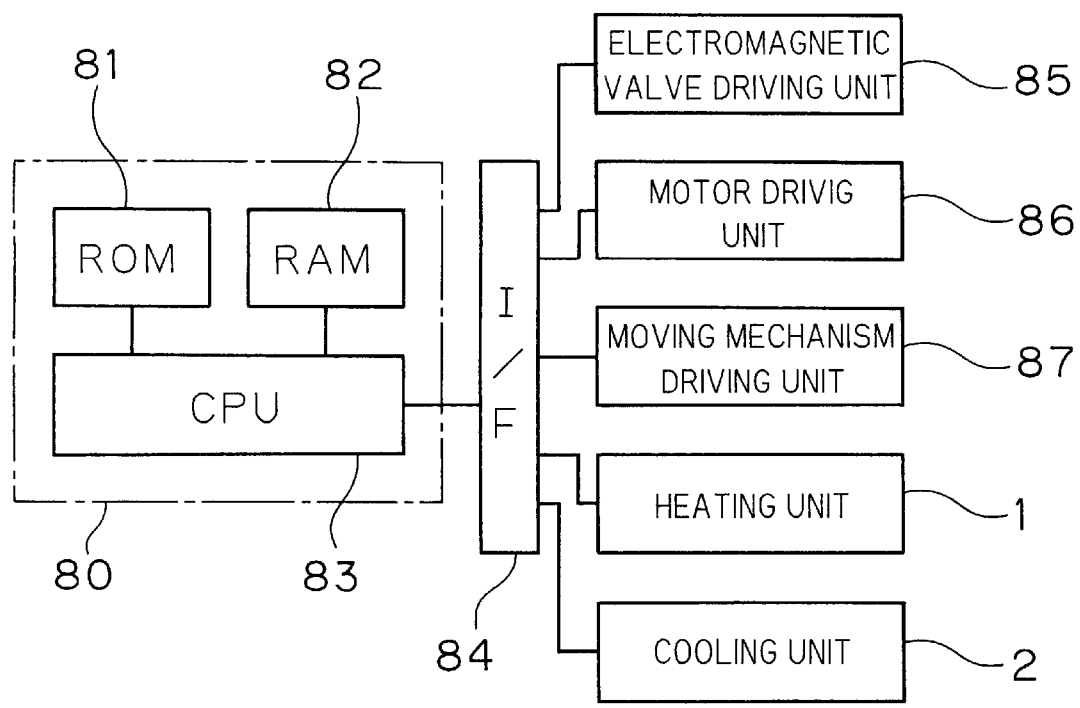
FIG. 7 is a block diagram showing main electric components of the substrate processing apparatus.

A mechanism of controlling the above-described substrate processing apparatus will now be described. FIG. 7 is a block diagram showing main electric components of the substrate processing apparatus.

The substrate processing apparatus has a control unit 80 including a ROM 81 in which an operation program necessary for controlling the apparatus is stored, a RAM 82 in which data or the like is temporarily stored at the time of control, and a CPU 83 for executing a logical operation. Control unit 80 is connected via an interface 84 to an electromagnetic valve driving unit 85 for driving electromagnetic valves 36, 48, 56, and 76, a motor driving unit 86 for driving motors 46 and 71, and a moving mechanism driving unit 87 for driving nozzle moving mechanism 32, brush moving mechanism 42, and nozzle moving mechanism 52. Control unit 80 is also connected to the above-described heating unit 1 and cooling unit 2 via interface 84.

Figure 8:
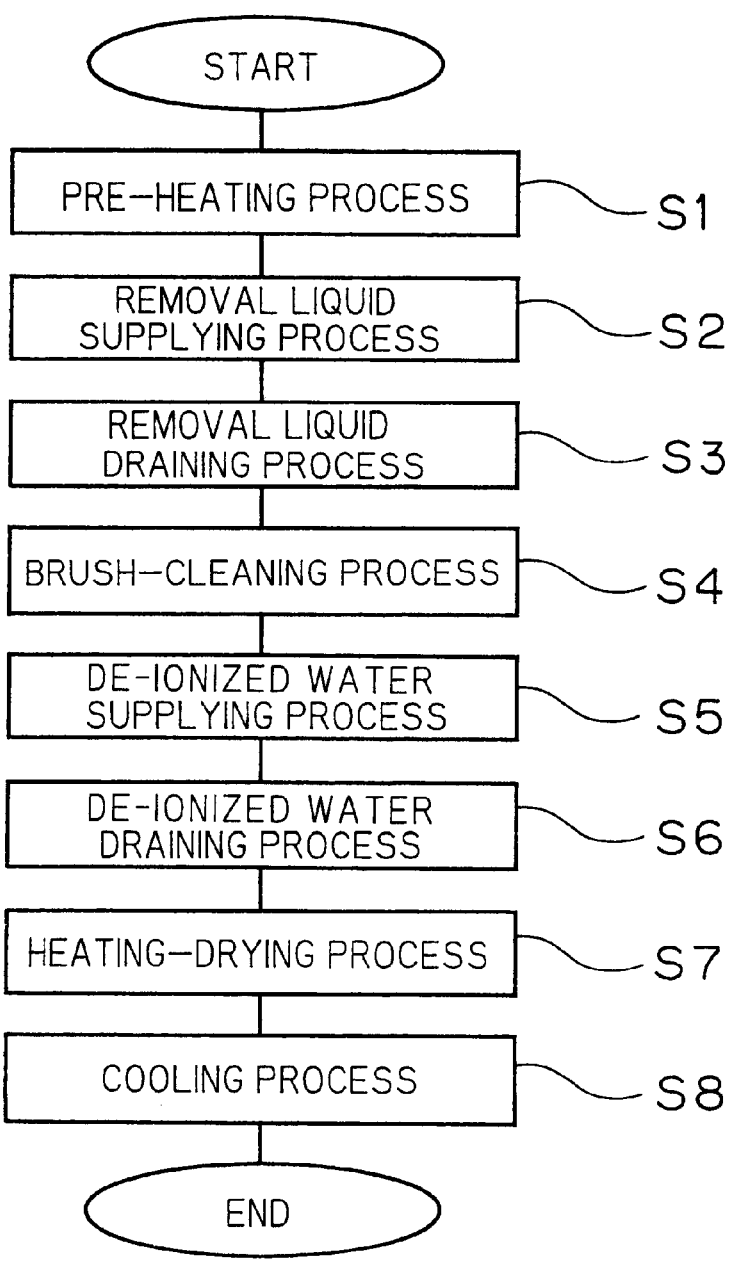
FIG. 8 is a flowchart showing operations of processing a wafer W by the substrate processing apparatus.

An operation for removing a reaction product from wafer W by the above-described substrate processing apparatus will now be described. FIG. 8 is a flowchart showing the operation for processing wafer W by the substrate processing apparatus.

In the case of removing a reaction product formed on the surface of wafer W on which a thin film formed is patterned by dry etching with a resist film as a mask by using the substrate processing apparatus, first, a pre-heating process is executed (step SI). The pre-heating process is executed in such a manner that wafer W in cassette 7 disposed on indexer 4 is unloaded by transporting mechanism 6, transported by transporting mechanism 5 to heating unit 1, and heated in a heating position on heating plate 12 shown in FIG. 2.

In the pre-heating process, wafer W is heated to a predetermined set temperature. It is sufficient to set the set temperature to a temperature at which the temperature of wafer W becomes equal to or higher than the temperature of a removal liquid (but lower than the boiling point of the removal liquid) when the removal liquid is supplied to wafer W in a removal liquid supplying process which will be described hereinlater.

Preferably, the temperature of wafer W is set to be almost equal to the temperature of the removal liquid when wafer W receives the supply of the removal liquid. Since the quantity of heat of wafer W lost during transportation of wafer W from heating unit 1 to spin cleaning unit 3 is small, the set temperature is set to the same temperature as that of the removal liquid. Specifically, since the removal liquid of 80 degrees centigrade is supplied in the removal liquid supplying process, the set temperature is 80 degrees centigrade.

However, when the temperature of wafer W decreases during transportation of wafer W from heating unit 1 to spin cleaning unit 3, preferably, the set temperature is higher than the temperature of the removal liquid only by an amount decreased during the transportation.

After completion of the pre-heating process on wafer W, the heated wafer W is transported by transporting mechanism 5 onto spin chuck 70 in spin cleaning unit 3 shown in FIGS. 4 to 6.

In spin cleaning unit 3, a removal liquid supplying process (step S2) is executed first. In the removal liquid supplying process, wafer W is held by spin chuck 70 and rotated at low speed. By the driving of nozzle moving mechanism 32 in removal liquid supplying mechanism 30, removal liquid discharge nozzle 31 is reciprocated between a position where it faces the center of rotation of wafer W held and rotated by spin chuck 70 and a position where it faces the periphery of wafer W, and electromagnetic valve 36 is opened to discharge the removal liquid from removal liquid discharge nozzle 31. By the operation, the removal liquid heated to a predetermined temperature (80 degrees centigrade in this case) higher than ordinary temperature (about 23 degrees) is supplied from removal liquid supply unit 37 to the entire surface of wafer W which is held and rotated by spin chuck 70. By the removal liquid supplying process, most of the reaction products generated on the surface of wafer W is removed.

Since wafer W to which the removal liquid is supplied has been pre-heated by the preceding pre-heating process, the temperature of the removal liquid does not decrease after the contact with wafer W. Consequently, the improved function of removing a reaction product by the heated removal liquid can be achieved.

Moreover, in this case, the temperature of wafer W is almost equal to that of the removal liquid, so that there is no temperature change in the removal liquid supplied to wafer W. Consequently, from the beginning of the removal liquid supplying process, the removal liquid is in contact with the reaction product at temperature at which the removing function can be effectively displayed. Thus, the reaction product can be promptly removed and the throughput is improved.

Subsequently, a removal liquid draining process for draining and removing a removal liquid attached to wafer W by rotating wafer W at high speed is executed (step S3). In the removal liquid draining process, wafer W is rotated at rotation speed of 500 rpm or higher, preferably, 1000 rpm to 4000 rpm by spin chuck 70.

The removal liquid draining process is executed subsequent to the removal liquid supplying process for the following reason. In the case such that an organic alkali liquid is used as a removal liquid, a phenomenon called a "pH shock" that strong alkali is generated when the removal liquid remained on wafer W is mixed with de-ionized water occurs, and a metal interconnection is damaged. Therefore, it is impossible to continuously execute the removal liquid supplying process and the brush cleaning process using de-ionized water. It is necessary to remove the removal liquid once from wafer W by using a large amount of an intermediate rinsing liquid after completion of the removal liquid supplying process and execute the brush cleaning process by supplying de-ionized water to wafer W. Consequently, it takes time for the intermediate rinsing liquid supplying process. Since a large amount of the intermediate rinsing liquid is used, a problem of high cost occurs.

In contrast, in the preferred embodiment, the removal liquid draining process is executed subsequent to the removal liquid supplying process. Consequently, the intermediate rinsing liquid supplying process can be omitted. Even in the case of executing the intermediate rinsing liquid supplying process, the process can be completed in short time by using only a small amount of intermediate rinsing liquid.

After completion of the removal liquid draining process, the brush cleaning process is executed (step S4). In the brush cleaning process, wafer W is held by spin chuck 70 and rotated at low speed. Electromagnetic valve 48 is opened to jet de-ionized water from de-ionized water jet nozzle 47 to the surface of wafer W held and rotated by spin chuck 70. Rotary brush 41 is rotated by the driving of motor 46 in brush cleaning mechanism 40 and is reciprocated by the driving of brush moving mechanism 42 between a position where rotary brush 41 faces the center of rotation of wafer W held by spin chuck 70 and rotated and a position where rotary brush 41 comes into contact with the periphery of wafer W. By the operation, the entire surface of wafer W held and rotated by spin chuck 70 is cleaned by rotary brush 41. By the brush cleaning process, a reaction product remained on the surface of wafer W can be promptly removed.

In place of making the lower end of rotary brush 41 come into contact with wafer W held and rotated by spin chuck 70, the surface of wafer W may be cleaned by disposing rotary brush 41 in a position where the lower end of rotary brush 41 and the surface of wafer W are apart from each other only by a small gap. In such a configuration, without shocking the surface of wafer W, the surface of wafer W can be cleaned with de-ionized water existing between the lower end of rotary brush 41 and the surface of wafer W.

After completion of the brush cleaning process, a de-ionized water supplying process is executed (step S5). In the de-ionized water supplying process, wafer W is held by spin chuck 70 and rotated at low speed. By the driving of nozzle moving mechanism 52 in de-ionized water supplying mechanism 50, de-ionized water discharge nozzle 51 is reciprocated between the position where it faces the center of rotation of wafer W held and rotated by spin chuck 70 and the position where it faces the periphery of wafer W, and electromagnetic valve 56 is opened to discharge de-ionized water from de-ionized water discharge nozzle 51. With the configuration, de-ionized water is supplied from de-ionized water supply unit 57 to the entire surface of wafer W held and rotated by spin chuck 70. By the de-ionized water supplying process, the surface of wafer W is cleaned.

In the removal liquid supplying process (step S2), brush cleaning process (step S4), and de-ionized water supplying process (step S5), electromagnetic valve 76 is opened to supply de-ionized water from back-face cleaning nozzle 74 to the back face of wafer W held and rotated by spin chuck 70, thereby enabling the reaction product or the like removed from the surface of wafer W to be prevented from being attached to the back side of wafer W.

A de-ionized water draining process for draining and removing the de-ionized water attached to wafer W by rotating wafer W at high speed is executed (step S6). In the de-ionized water draining process, wafer W is rotated by spin chuck 70 at rotational speed of 500 rpm or higher, preferably, 1000 rpm to 4000 rpm.

After completion of the processes, wafer W is transported by transporting mechanism 5 from spin cleaning unit 3 to heating unit 1. In heating unit 1, a heating-drying process is executed (step S7). In the heating-drying process, wafer W is heated in the heating position on heating plate 12 so that the de-ionized water which cannot be removed by the de-ionized water draining process is removed by being dried.

Therefore, occurrence of a problem such that de-ionized water remains in a metal pattern on wafer W from which the reaction product has been removed and an oxide is generated can be prevented. Also in the case where wafer W is subsequently transported to a place where a process is performed under vacuum condition such as CVD, the de-ionized water attached to wafer W does not exert an adverse influence on the process. In the heating-drying process, wafer W is heated to, for example, the temperature of about 150 degrees centigrade.

After completion of the heating-drying process on wafer W, heated wafer W is transported to cooling unit 2 by transporting mechanism 5. In cooling unit 2, heated wafer W is cooled to temperature about ordinary temperature at which no trouble occurs in the following processes. Cooled wafer W is unloaded from cooling unit 2 by transporting mechanism 5 and housed into cassette 7 by transporting mechanism 6.

Although the substrate processing apparatus of the preferred embodiment has heating plate 12 as heating means, heating gas supplying means having a gas nozzle for spraying a heated gas (heated air or heated inert gas such as nitrogen gas or argon) to the substrate may be also used. In this case, the gas nozzle may be provided for heating unit 1 or spin cleaning unit 3.

In the case of providing the gas nozzle for spin cleaning unit 3, the pre-heating process or heating-drying process can be performed by the spin cleaning unit 3, so that heating plate 12 is unnecessary. Moreover, the time required to transport wafer W between heating plate 12 and spin cleaning unit 3 is also unnecessary, so that the throughput is improved.

In this case, by rotating wafer W in the pre-heating process and heating-drying process, heat is transferred relatively uniformly. Thus, in-plane uniformity of the process is improved.

In the case of providing the heated gas nozzle for spin cleaning unit 3, the gas nozzle can be provided for arm 34, 44, or 54.

Particularly, in the case where the gas nozzle is provided at the tip of arm 34 as a component of removal liquid supplying mechanism 30, in the pre-heating process, by opening electromagnetic valve 36 immediately after supplying heated gas in a state where the gas nozzle faces wafer W, since removal liquid discharge nozzle 31 has already reached the position where removal liquid discharge nozzle 31 faces the substrate, the removal liquid can be supplied before the temperature of wafer W decreases largely. Consequently, only the minimum energy is necessary for heating wafer W. Since the time required for the transfer from the pre-heating process to the removal liquid supplying process can be shortened, the throughput is improved.

2. Second to Fourth Embodiments

In each of the following preferred embodiments, a wafer denotes a semiconductor substrate, more particularly, a silicon wafer. The substrate has a thin film. The thin film is a metal film or insulating film. A metal contained in the metal film is any of copper, aluminum, titanium, and tungsten and mixtures of the materials. The insulating film includes an oxide film or nitride film of the metal, a silicon oxide film, a silicon nitride film, an organic insulating film and a low dielectric interlayer insulating film. The thin film includes obviously a thin film having a height shorter than the length of a bottom portion in a cross section in the direction perpendicular to the wafer on which the thin film is formed but also a thin film having a height longer than the length of the bottom portion. It consequently includes a thin film existing in a linear or island shape when viewed from the position facing the wafer such as a film, a pattern, or the like partly formed on the wafer.

On the wafer subjected to the process of dry-etching the thin film by using the patterned resist film as a mask, a polymer as a reaction product derived from the resist or thin film is generated.

The wafer process in each of the following preferred embodiments is a polymer removing process for removing the polymer from the wafer.

In the following, the polymer removed from the wafer may be also described as a contaminant.

The removal liquid in each of the preferred embodiments is a polymer removal liquid. The polymer removal liquid is a liquid for selectively removing only polymers and includes an organic amine removal liquid containing an organic amine such as dimethyl sulfoxide or dimethylformamide, an ammonium fluoride removal liquid containing ammonium fluoride, and an inorganic removal liquid.

Organic amine removal liquids include a solution of monoethanolamine, water, and aromatic triol, a solution of 2-(2-aminoethoxy)ethanol, hydroxy amine, and catechol, a solution of alkanolamine, water, dialkyl sulfoxide, hydroxy amine, and an amine corrosion preventive, a solution of alkanol amine, glycol ether, and water, a solution of dimethyl sulfoxide, hydroxy amine, triethylenetetraamine, pyrocatechol, and water, a solution of water, hydroxy amine, and pyrogallol, a solution of 2-aminoethanol, ethers, and sugar alcohols, and a solution of 2-(2-aminoethoxy)ethanol, N,N-dimethylacetamide, water, triethanol amine.

Ammonium fluoride removal liquids include a solution of organic alkali, sugar alcohol, and water, a solution of a fluorine compound, organic carbolic acid, and acid amide solvent, a solution of alkyl amide, water, and ammonium fluoride, a solution of dimethyl sulfoxide, 2-aminoethanol, organic alkali solution, and aromatic hydrocarbon, a solution of dimethyl sulfoxide, ammonium fluoride, and water, a solution of ammonium fluoride, triethanolamine, pentamethyl diethylenetriamine, iminodiacetic acid, and water, a solution of glycol, alkyl sulfate, organic salt, organic acid, and inorganic salt, a solution of amide, organic salt, organic acid, and inorganic salt, and a solution of amide, organic salt, organic acid, and inorganic salt.

An example of the inorganic removal liquid is a solution of water and a phosphoric acid derivative.

The organic solvent here denotes a hydrophilic organic solvent and a water-soluble organic solvent. More specifically, it is a liquid which is mixed with water, and the boiling point of the mixture is decreased. Ketones, ethers, and polyalcohol can be used. For example, as a ketone, aceton or diethyl ketone can be used. As ethers, methyl ether and ethyl ether can be used. As polyalcohol, ethylene glycol can be used. Considering that a number of organic solvents each having a small content of an impurity such as a metal are provided in the market, it is the most preferable to use isopropyl alcohol (IPA). In each of the following preferred embodiments, IPA is used.

2-1 Second Embodiment 2-1-1 Substrate Processing Apparatus 2-1-1-1 General Configuration A second preferred embodiment of the invention will now be described hereinbelow.

Figure 9:
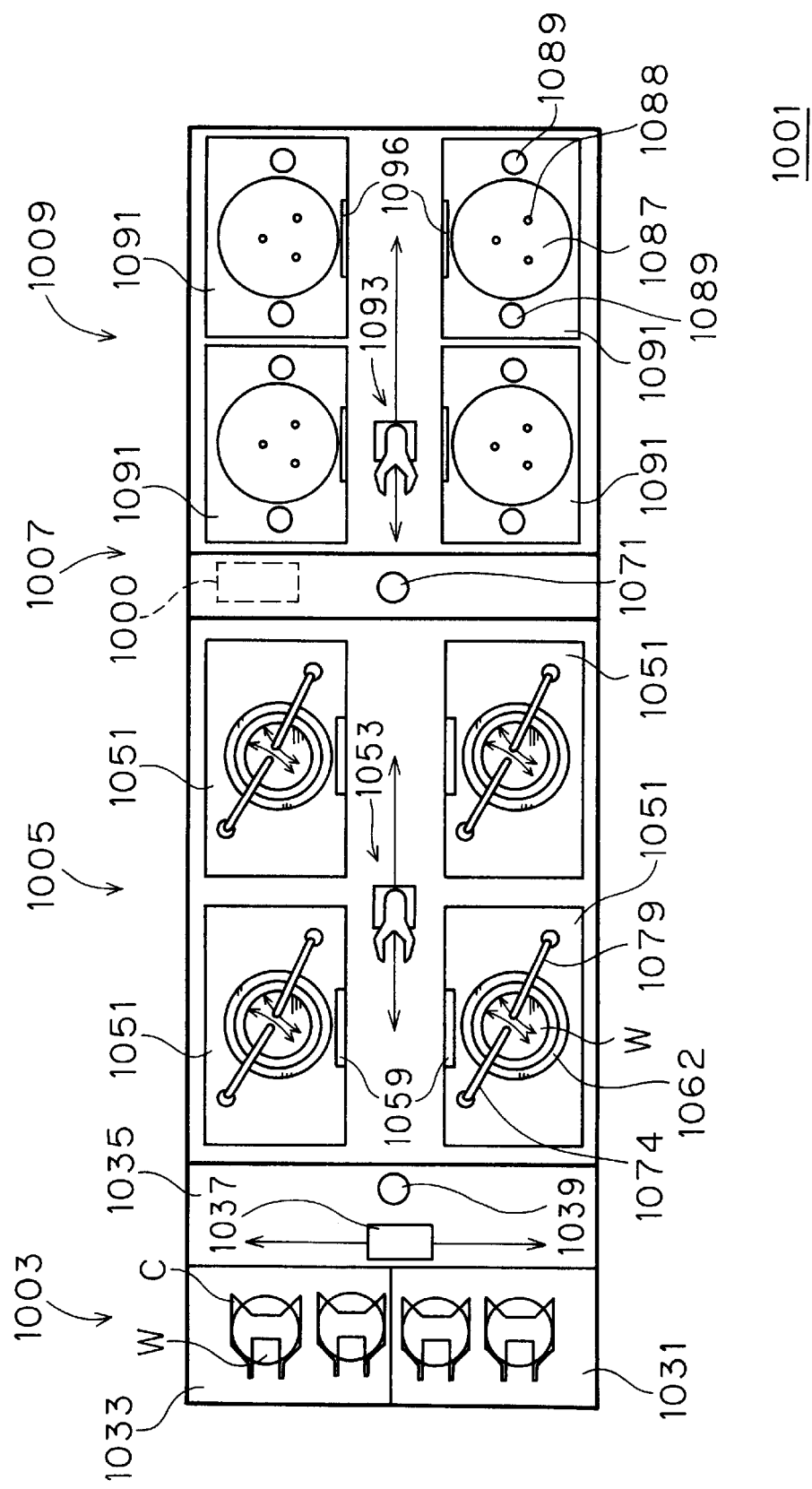
FIG. 9 is a top view of a substrate processing apparatus.

FIG. 9 is a top view of a substrate processing apparatus 1001.

Substrate processing apparatus 1001 has a loading/unloading section 1003, a rotary processing section 1005, an interface 1007, and a drying section 1009 which are arranged in a line.

Loading/unloading section 1003 includes a loading unit 1031 on which a carrier C housing unprocessed wafer W is placed, an unloading unit 1033 on which carrier C housing processed wafer W is placed, and a delivery unit 1035.

Loading unit 1031 has a mounting table onto which two carriers C are loaded by a transporting mechanism outside of the apparatus. Carrier C holds, for example, 25 wafers W arranged in the vertical direction with gaps, each in a horizontal posture.

Unloading unit 1033 also has a mounting table onto which two carriers C are placed, and the two carriers C are unloaded by the transporting mechanism on the outside of the apparatus.

Delivery unit 1035 has a loading/unloading mechanism 1037 which moves along the arrangement direction of carriers C in loading unit 1031 and unloading unit 1033 and loads or unloads wafer W to/from carrier C and a first delivery stand 1039. Loading/unloading mechanism 1037 supplies/receives wafer W to/from first delivery stand 1039.

Rotary processing section 1005 is provided adjacent to loading/unloading section 1003. Rotary processing section 1005 has a rotary processing unit 1051, housing wafer W, and performing the reaction product removing process, and a first substrate transporting mechanism 1053 for receiving/supplying wafer W from/to the delivery stand and receiving/supplying wafer W from/to rotary processing unit 1051.

Two rotary processing units 1051 arranged in the direction orthogonal to the arrangement direction of carriers C of loading/unloading section 1003 form a line. Total two lines of rotary processing units 1051 are arranged with a gap along the arrangement direction of carriers C. Between the lines of rotary processing units 1051, first substrate transporting mechanism 1053 is provided.

The details of rotary processing unit 1051 will be described hereinlater.

First substrate transporting mechanism 1053 travels along the lines of rotary processing units 1051, receives/supplies wafer W from/to each of rotary processing units 1051, and receives/supplies wafer W also from/to a first delivery stand 1039. First substrate transporting mechanism 1053 receives/supplies wafer W also from/to a second delivery stand 1071 which will be described hereinlater.

Interface 1007 is provided adjacent to rotary processing section 1005 and has second delivery stand 1071 on which wafer W is placed.

A drying unit 1091 is provided adjacent to interface 1007. Two drying units 1091 arranged in the direction orthogonal to the arrangement direction of carriers C of loading/unloading section 1003 form a line. Total two lines of drying units 1091 are arranged with a gap along the arrangement direction of carriers C. Between the lines of drying units 1091, second substrate transporting mechanism 1093 is provided.

The details of drying unit 1091 will be described hereinlater.

Second substrate transporting mechanism 1093 travels along the lines of drying units 1091, supplies/receives wafer W to/from each of drying units 1091, and supplies/receives wafer W to/from second delivery stand 1071.

In substrate processing apparatus 1001, a control unit 1000 which takes the form of a microcomputer mainly having a memory and a CPU and realizes a substrate processing method to be described hereinlater by controlling the operations of the components is provided.

2-1-1-2 Rotary Processing Unit

Figure 10:
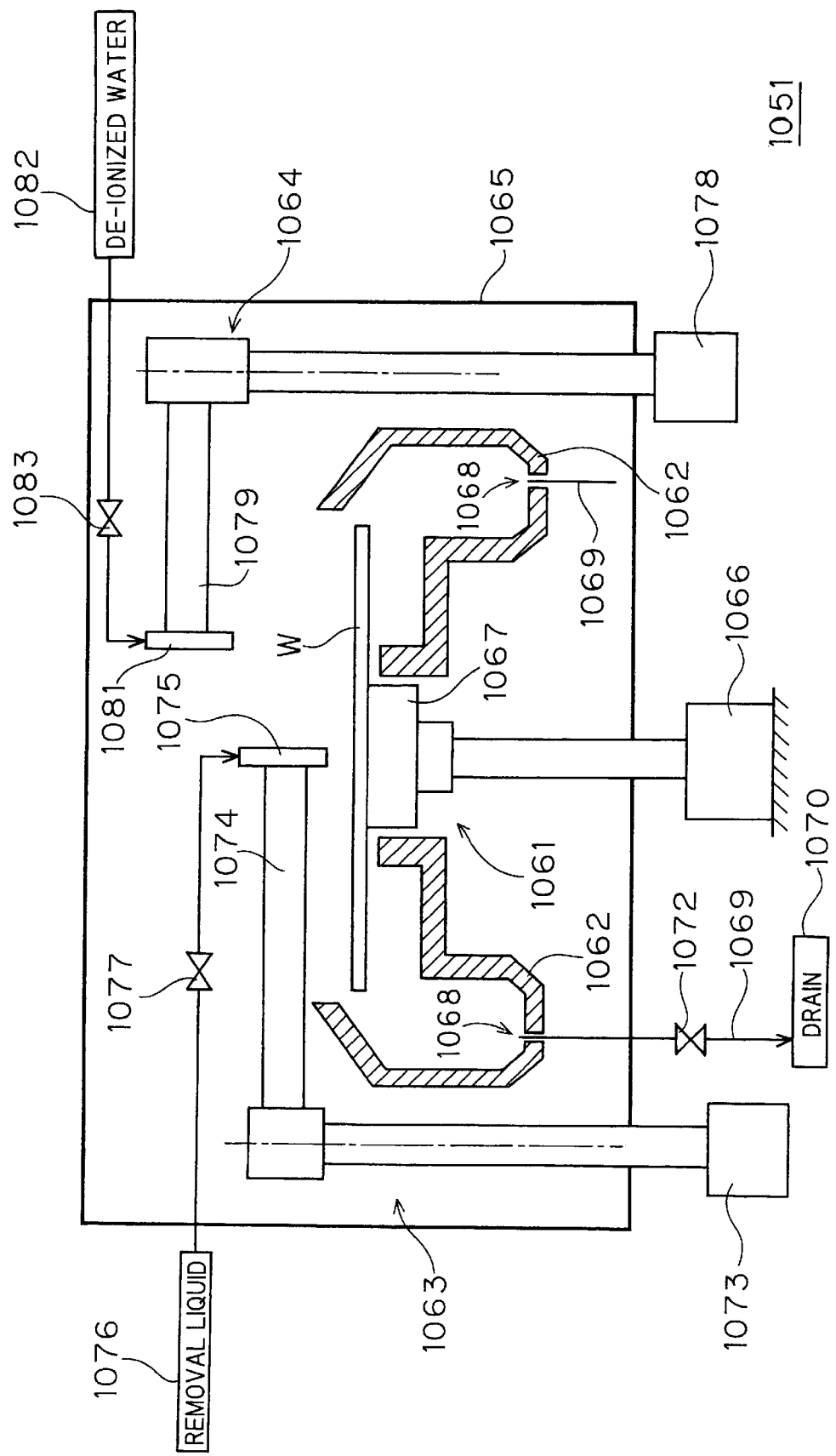
FIG. 10 is a diagram showing a rotary processing unit.

Rotary processing unit 1051 will now be described by referring to FIG. 10. FIG. 10 is a front view of rotary processing unit 1051.

Rotary processing unit 1051 has a substrate holding means 1061 for holding and rotating a single substrate while holding the substrate in a horizontal state, a cup 1062 for surrounding held wafer W, a removal liquid supplying means 1063 for supplying a removal liquid to held wafer W, a de-ionized water supplying means 1064 for supplying de-ionized water to held wafer W, and a chamber 1065 for housing wafer W held by substrate holding means 1061.

Chamber 1065 is provided with a shutter 1059 (refer to FIG. 9). When first substrate transporting mechanism 1053 loads/unloads wafer W into/from chamber 1065, shutter 1059 is opened. In the other cases, shutter 1059 is closed. The inside of chamber 1065 is under normal pressure.

Substrate holding means 1061 has a motor 1066 provided on the outside of chamber 1065 and a chuck 1067 rotating around the shaft extending in the vertical direction as a center by being driven by motor 1066. Chuck 1067 is elevated by a not-shown mechanism.

Although substrate holding means 1061 is provided in chamber 1065, the pressure in chamber 1065 is not reduced. In substrate processing apparatus 1001, the pressure in a sealed chamber 1086 which will be described hereinlater is reduced. Substrate holding means 1061 is provided on the outside of sealed chamber 1086.

Cup 1062 has an almost doughnut shape in top view having an opening in the center, through which chuck 1067 can pass. Cup 1062 captures a liquid (for example, removal liquid and de-ionized water) spread from wafer W rotating and discharges the captured liquid from a drain port 1068 provided in the lower part. Drain port 1068 is provided with a drain pipe 1069 communicated with a drain 1070. In some midpoint of drain pipe 1069, a drain valve 1072 for opening/closing drain pipe 1069 is provided.

Removal liquid supplying means 1063 has a motor 1073 provided on the outside of chamber 1065, an arm 1074 swung by the driving of motor 1073, a removal liquid nozzle 1075 provided at the tip of arm 1074, for discharging the removal liquid downward, and a removal liquid source 1076 for supplying a removal liquid toward removal liquid nozzle 1075. Between removal liquid nozzle 1075 and removal liquid source 1076, a duct is provided. The duct is provided with a removal liquid valve 1077. A not-illustrated elevating means for elevating motor 1073 to thereby elevate removal liquid nozzle 1075 is also provided.

By driving motor 1073, removal liquid nozzle 1075 is reciprocated between a discharge position above the center of rotation of wafer W and a standby position outside of cup 1062.

De-ionized water supplying means 1064 has a motor 1078 provided on the outside of chamber 1065, an arm 1079 swung by the driving of motor 1078, a de-ionized water nozzle 1081 provided for arm 1079, for discharging de-ionized water downward, and a de-ionized water source 1082 for supplying de-ionized water toward de-ionized water nozzle 1081. Between de-ionized water nozzle 1081 and de-ionized water source 1082, a duct is provided. The duct is provided with a de-ionized water valve 1083. A not-illustrated elevating means for elevating motor 1078 to thereby elevate de-ionized water nozzle 1081 is also provided.

By driving motor 1078, de-ionized water nozzle 1081 is reciprocated between a discharge position over the center of rotation of wafer W and a standby position outside of cup 1062.

2-1-1-3 Drying Unit

Figure 11:
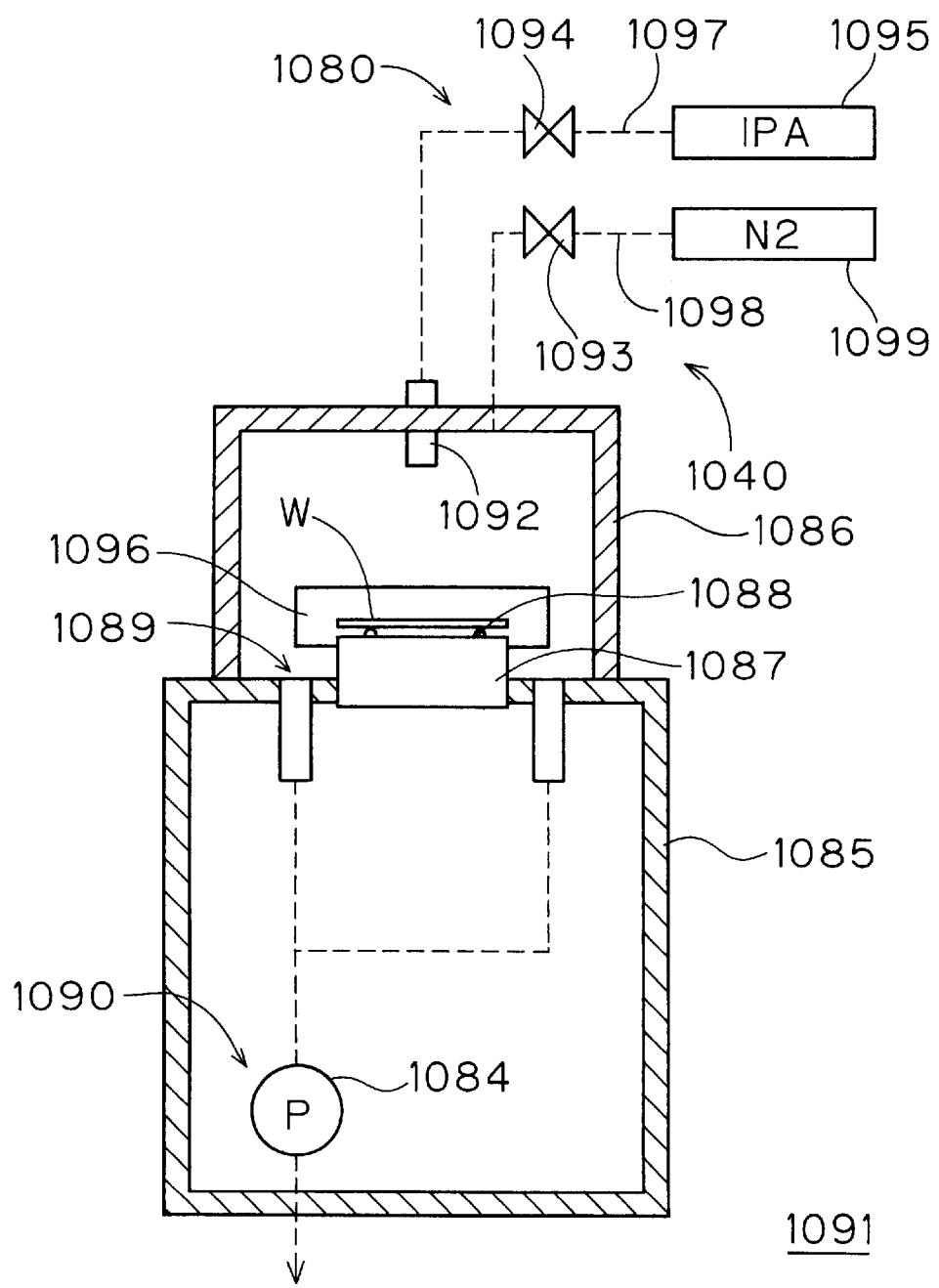
FIG. 11 is a diagram showing a drying unit.

FIG. 11 is a front view of drying unit 1091.

Drying unit 1091 has hermetically sealed chamber 1086 provided on a frame 1085, a temperature adjusting plate 1087 whose top part is disposed in the sealed chamber 1086 and which has a temperature adjusting mechanism, a pressure reducing means 1090 for reducing pressure in sealed chamber 1086, a pressure normalizing means 1040 for setting the reduced pressure in the sealed chamber 1086 back to a normal pressure, and a solvent steam supplying means 1080 for supplying steam of an organic solvent into sealed chamber 1086. Pressure reducing means 1090 has a pump 1084 and a duct for communicating pump 1084 and sealed chamber 1086.

Sealed chamber 1086 is provided with a shutter 1096. When the second substrate transporting mechanism 1093 loads/unloads wafer W into/from sealed chamber 1086, shutter 1096 is opened. In the other cases, shutter 1096 is closed to keep the air tightness in sealed chamber 1086. An exhaust port 1089 is provided in the lower part of sealed chamber 1086 and is communicated with pump 1084 via a duct. Pump 1084 exhausts atmosphere in sealed chamber 1086, thereby reducing the pressure in sealed chamber 1086.

In sealed chamber 1086, temperature adjusting plate 1087 is projected. Temperature adjusting plate 1087 has therein a heating or cooling mechanism to adjust the temperature of wafer W. Temperature adjusting plate 1087 is provided with three pins 1088 on which wafer W is to be placed. Pins 1088 go up when wafer W is supplied/received to/from a second substrate transporting mechanism 1093 and go down when wafer W is subjected to a drying process. When pins 1088 go down and the drying process is performed, the top of each pin 1088 is slightly projected from the top face of temperature adjusting plate 1087, so that a small gap exists between wafer W and temperature adjusting plate 1087.

Solvent steam supplying means 1080 has a solvent steam supplying nozzle 1092 for supplying solvent steam (IPA= isopropyl alcohol) into sealed chamber 1086, a solvent steam source 1095 for sending the solvent steam to solvent steam supplying nozzle 1092, and a solvent valve 1094 provided for a solvent duct 1097 between solvent steam source 1095 and solvent steam supplying nozzle 1092.

The solvent steam in this case includes a fog-state organic solvent constructed by fine droplets and a vapor organic solvent. Consequently, solvent steam source 1095 includes, as solvent steam generating means, ultrasonic vaporizing means for applying an ultrasonic wave to the liquid IPA to obtain solvent steam, heating vaporizing means for heating the liquid IPA to obtain solvent steam, and bubbling vaporizing means for supplying bubbles of inert gas such as nitrogen to the liquid IPA to obtain solvent steam.

To sealed chamber 1086, a gas pipe 1098 led from an N2 source 1099 as a source of supplying an inert gas (nitrogen gas in this case) is connected. In some midpoint of gas pipe 1098, a gas valve 1093 for opening/closing passage of gas pipe 1098 is provided. Pressure normalizing means 1040 for normalizing the pressure in sealed chamber 1086 has gas pipe 1098, gas valve 1093, and N2 source 1099.

2-1-2 Substrate Processing Method

A substrate processing method using substrate processing apparatus 1001 will now be described.

Figure 12:
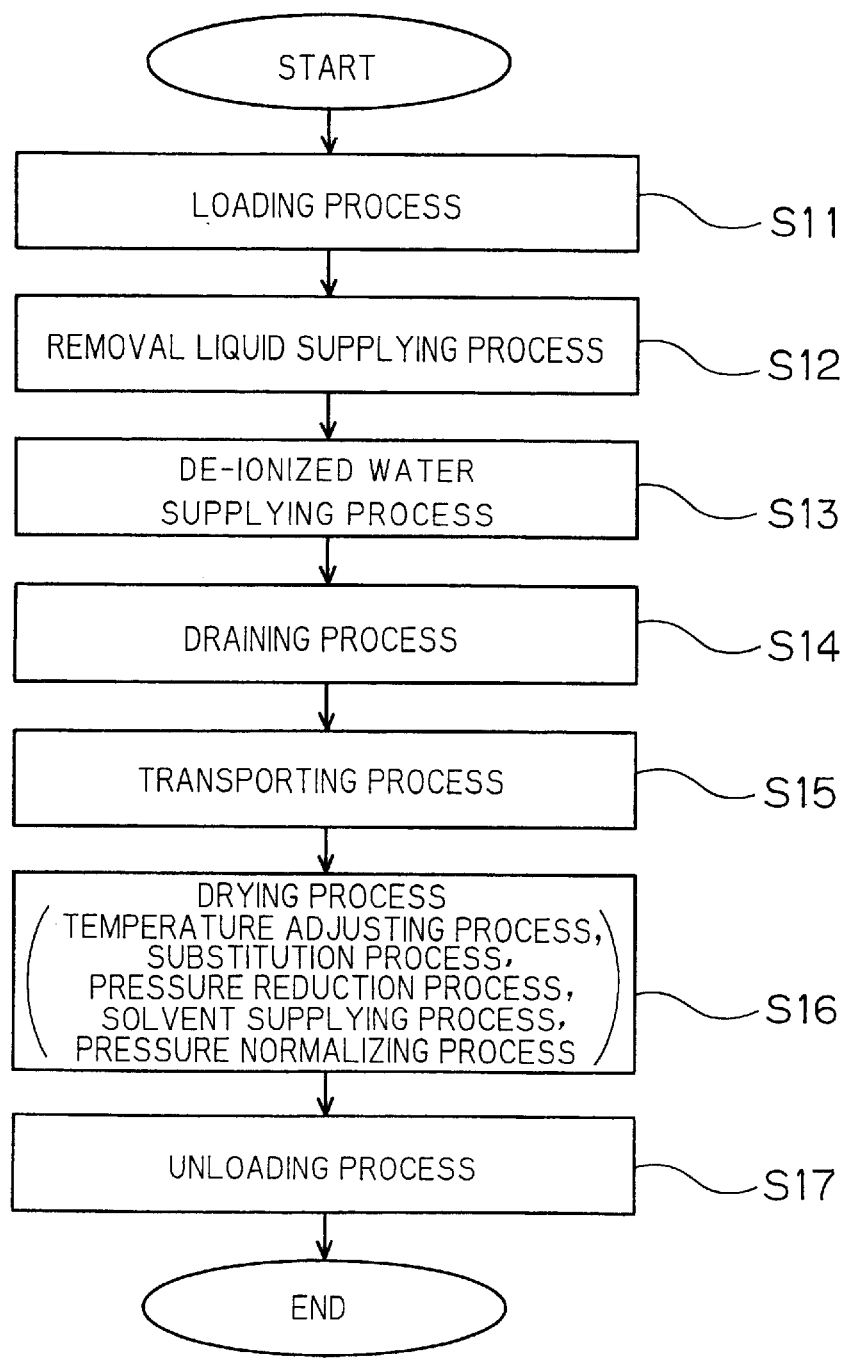
FIG. 12 is a flowchart showing the procedure of a substrate processing method using substrate processing apparatus.

FIG. 12 is a flowchart showing the procedure of the substrate processing method using substrate processing apparatus 1001. The substrate processing method mainly includes the loading process, removal liquid supplying process, de-ionized water supplying process, draining process, transporting process, drying process, and unloading process.

2-1-2-1 Transportation of Wafer from Loading/Unloading Section 1003 to Rotary Processing Unit 1051

First, the loading process is executed (step S11). Specifically, wafer W housed in carrier C is loaded into loading unit 1031. Wafer W has a thin film and the thin film has been subjected to dry etching using the patterned resist film as a mask. Due to the process, a reaction product derived from the resist film and the thin film is attached to wafer W.

One wafer W is loaded from carrier C in loading unit 1031 by loading/unloading mechanism 1037 and placed onto first delivery stand 1039.

Wafer W placed on first deliver stand 1039 is transported by first substrate transporting mechanism 1053 and loaded into predetermined one of four rotary processing units 1051.

In rotary processing unit 1051, shutter 1059 is opened and wafer W transported by first substrate transporting mechanism 1053 is received and held by chuck 1067.

2-1-2-2 Process in Rotary Processing Unit

In rotary processing unit 1051 which has received wafer W, substrate holding means 1061 holds the wafer. Drain valve 1072 is left opened.

Subsequently, substrate holding means 1061 rotates motor 1066 to rotate wafer W.

When wafer W reaches a predetermined rotational speed, the removal liquid supplying process is executed (step S12). In the removal liquid supplying process, motor 1073 drives and removal liquid nozzle 1075 in the standby position accordingly moves to the discharge position. Removal liquid valve 1077 is opened to supply the removal liquid from removal liquid nozzle 1075 to wafer W. The removal liquid supplied to wafer W is dropped outside of wafer W, collected by cup 1062, and discharged via drain pipe 1069 to drain 1070. After supplying the removal liquid for predetermined time, removal liquid valve 1077 is closed and removal liquid nozzle 1075 is returned to the standby position.

Since the removal liquid supplied to wafer W acts on the reaction product on the substrate in the removal liquid supplying process, the reaction product on the substrate comes to be easily dropped from the substrate. Consequently, the reaction product is gradually removed from wafer W by the rotation of wafer W and supply of the removal liquid.

Subsequently, the de-ionized water supplying process is executed (step S13).

In the de-ionized water supplying process, motor 1078 drives to move de-ionized water nozzle 1081 in the standby position to the discharge position. De-ionized water valve 1083 is opened to supply de-ionized water from de-ionized water nozzle 1081 to wafer W. The de-ionized water supplied to wafer W is dropped out of wafer W, collected by cup 1062, and drained via drain pipe 1069 to drain 1070. After supplying the de-ionized water for predetermined time, de-ionized water valve 1083 is closed and de-ionized water nozzle 1081 is returned to the standby position.

In the de-ionized water supplying process, the de-ionized water supplied to wafer W washes out a contaminant such as the removal liquid and the reaction product.

Subsequently, the draining process is executed (step S14).

In the draining process, by rotating wafer W at high speed, the liquid on wafer W is drained, and wafer W is almost dried.

2-1-2-3 Transportation of Wafer from Rotary Processing Unit to Drying Unit

After completion of the process in rotary processing unit 1051, the transporting process for transporting the processed wafer from rotary processing unit 1051 to drying unit 1091 is executed (step S15). Specifically, shutter 1059 is opened and wafer W is unloaded by first substrate transporting mechanism 1053. First substrate transporting mechanism 1053 places wafer W onto second delivery stand 1071. Wafer W is transported from second delivery stand 1071 by second substrate transporting mechanism 1093 and loaded into any of drying units 1091. In drying unit 1091, shutter 1096 is opened, and second substrate transporting mechanism 1093 places wafer W onto elevated pins 1088. After that, shutter 1096 is closed to assure air tightness of sealed chamber 1086.

2-1-2-4 Process in Drying Unit

In drying unit 1091, a drying process is executed. The drying process is executed by a temperature adjusting process, a substitution process, a pressure reducing process, a gas supplying process, a solvent supplying process, and a pressure normalizing process (step S16).

Before wafer W is loaded in sealed chamber 1086, temperature adjusting plate 1087 is set to a drying temperature below the ignition point of an organic solvent. In this embodiment, drying temperature is set in a range from 30 degrees to 40 degrees in consideration that IPA is used as an organic solvent. Since the temperature adjusting control of temperature adjusting plate 1087 is performed before wafer W is loaded to thereby set temperature adjusting plate 1087 to a predetermined temperature, deterioration in throughput can be prevented.

Pins 1088 are lowered to make wafer W and temperature adjusting plate 1087 come nearer to each other, and the temperature adjusting process for heating wafer W is performed.

After closing shutter 1096, pump 1084 is driven to exhaust the atmosphere in sealed chamber 1086 and gas valve 1093 is opened to introduce nitrogen gas into sealed chamber 1086. In such a manner, the substitution process of substituting the atmosphere in sealed chamber 1086 with nitrogen atmosphere from air is executed.

While continuing the driving of pump 1084, gas valve 1093 is closed to stop the supply of nitrogen gas into sealed chamber 1086, thereby reducing the pressure in sealed chamber 1086. In such a manner, the pressure reducing process of decreasing the atmospheric pressure in sealed chamber 1086 to be lower than the normal pressure (101325 Pa) is executed. In this case, the pressure in sealed chamber 1086 is set to 666.5 Pa to 6665 Pa, preferably, 666.5 Pa to 2666 Pa.

After gas valve 1093 is closed, while continuing the driving of pump 1084, solvent valve 1094 is opened. In such a manner, the solvent supplying process for supplying an organic solvent from solvent steam nozzle 1092 to sealed chamber 1086 is executed. After opening solvent valve 1094 for predetermined time, solvent valve 1094 is closed.

After closing solvent valve 1094, while continuing the driving of pump 1084, gas valve 1093 is opened again. In such a manner, the pressure normalizing process for normalizing the pressure in sealed chamber 1086 is executed.

After elapse of predetermined time, in a state where gas valve 1093 is opened, the driving of pump 1084 is stopped. After that, gas valve 1093 is closed and the drying process is finished.

Since wafer W is heated in the temperature adjusting process, water content remained on wafer W easily evaporates. Moreover, the atmospheric pressure around wafer W is reduced in the pressure reducing process. Consequently, the boiling point of the liquid decreases, and the de-ionized water remained on wafer W easily evaporates.

Further, steam of the organic solvent is supplied to wafer W during the pressure reducing process. Consequently, the organic solvent is mixed with the water content remained on wafer W. Since the boiling point of the mixture of water and the organic solvent is lower than that of water, it easily evaporates from wafer W and the water content can be taken from wafer W. Moreover, since wafer W is heated in the temperature adjusting process and the atmospheric pressure around wafer W is decreased in the pressure reducing process, the mixture of water and the organic solvent easily evaporates in short time. Therefore, wafer W can be dried extremely certainly.

The drying process can be also executed by the pressure reducing process and the pressure normalizing process.

In this case, by the drop in atmospheric pressure around wafer W, the boiling point of the water content remained on wafer W decreases, and the water content easily evaporates. Thus, the drying operation can be easily executed.

The drying process can be executed by the pressure reducing process, the solvent supplying process, and the pressure normalizing process.

In this case, although the mixture of water on the substrate and the organic solvent is generated, since the boiling point of the mixture is lower than that of water, the mixture easily evaporates. Moreover, the boiling point of the mixture is reduced by the decrease in atmospheric pressure around wafer W, so that the water content can be evaporated in shorter time with reliability.

The drying process can be also executed by the pressure reducing process, the temperature adjusting process, and the pressure normalizing process.

In this case, since the water content on the substrate is heated in the temperature adjusting process and the atmospheric pressure around wafer W is decreased, the water content evaporates in short time with reliability.

The drying process can be executed only by the solvent supplying process.

In this case, although the mixture of water on the substrate and the organic solvent is generated, since the boiling temperature of the mixture is lower than that of water, the mixture easily evaporates. Thus, wafer W can be dried in short time with reliability.

The drying process may be executed by the temperature adjusting process and the solvent supplying process.

In this case, although the mixture of water on the substrate and the organic solvent is generated, since the boiling point of the mixture is lower than that of water, the mixture easily evaporates. Moreover, since the mixture is heated in the temperature adjusting process, the mixture easily reaches the boiling point and evaporates. Thus, wafer W can be dried with reliability in short time.

2-1-2-5 Transportation of Wafer from Drying Unit to Unloading Unit

When the drying process in the drying unit 1091 is completed, all the wafer treatment is completed, so that the unloading process for transporting the treated wafer W to unloading unit 1033 is performed (step S17).

First, pins 1088 of drying unit 1091 are elevated and shutter 1096 is opened. By second substrate transporting mechanism 1093, wafer W is unloaded from drying unit 1091. Subsequently, second substrate transporting mechanism 1093 places wafer W onto second delivery stand 1071.

First substrate transporting mechanism 1053 carries out wafer W on second delivery stand 1071 and places it onto first delivery stand 1039. Wafer W placed on first delivery stand 1039 is carried by loading/unloading mechanism 1037 and loaded into carrier C placed on unloading unit 1033.

When each of first and second delivery stands 1039 and 1071 is constructed by a plurality of substrate placing means such as a number of stands, processed wafer W and unprocessed wafer W can simultaneously exist in interface 1007. Thus, deterioration in throughput can be prevented.

2-2 Third Embodiment 2-2-1 Substrate Processing Apparatus

The third preferred embodiment will now be described. The substrate processing apparatus according to the third preferred embodiment is similar to substrate processing apparatus 1001 shown in FIG. 9 except that interface 1007 and drying section 1009 are omitted and rotary processing unit 1051 in rotary processing section 1005 is replaced by a rotary processing unit 1151 which will be described hereinlater.

Figure 13:
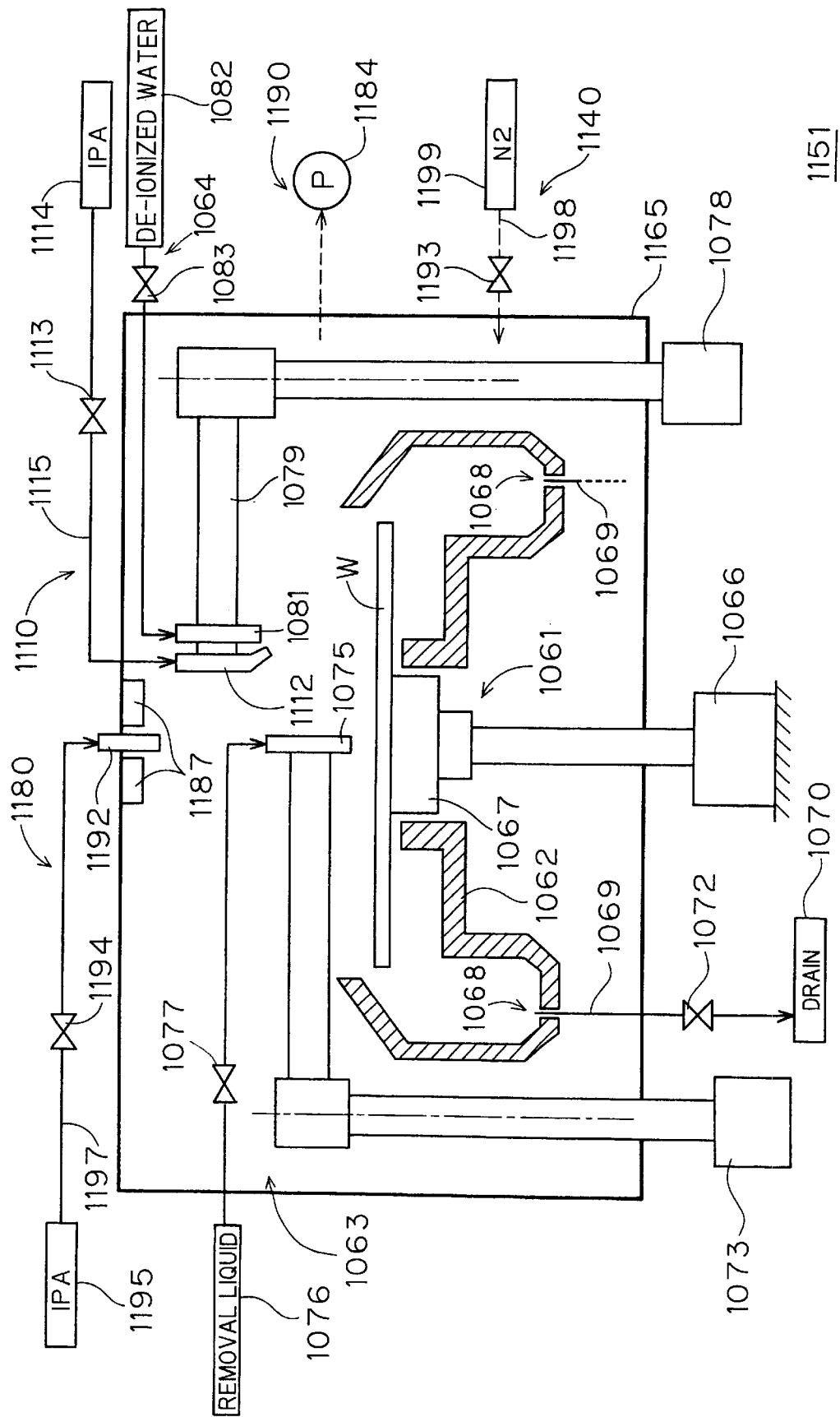
FIG. 13 is a diagram showing a rotary processing unit.

FIG. 13 is a diagram for explaining rotary processing unit 1151. Rotary processing unit 1151 has, in addition to the configuration of rotary processing unit 1051, a solvent liquid supplying means 1110 or solvent steam supplying means 1180. Rotary processing unit 1151 also has a temperature adjusting means 1187, a sealed chamber 1165, a pressure reducing means 1190, and a pressure normalizing means 1140. The components similar to those in rotary processing unit 1051 are designated by the same reference numerals and their description will not be repeated.

In sealed chamber 1165, in a position similar to shutter 1059 (FIG. 9), a sealing shutter (not shown) is provided. When first substrate transporting mechanism 1053 loads/unloads wafer W to/from chamber 1165, the sealed shutter is opened. In the other cases, the sealed shutter is closed. In such a manner, the air tightness of sealed chamber 1165 is assured.

Temperature adjusting means 1187 is provided above wafer W and adjusts the temperature of wafer W. As temperature adjusting means 1187, hot air supplying means for supplying hot air to wafer W, heated nitrogen gas supplying means for supplying heated nitrogen gas to wafer W, irradiating means for irradiating wafer with light such as infrared or an electromagnetic wave, and the like can be mentioned. In place of temperature adjusting means 1187, temperature adjusting means can be realized by assembling heating means into chuck 1067.

Solvent liquid supplying means 1110 is means for supplying a liquid organic solvent (called solvent liquid) to wafer W and has a solvent liquid nozzle 1112 provided for arm 1079, for discharging the solvent liquid downward and a solvent liquid source 1114 for supplying the solvent liquid toward solvent liquid nozzle 1112. A solvent liquid pipe 1115 is provided between solvent liquid nozzle 1112 and solvent liquid source 1114, and is provided with a solvent liquid valve 1113. The tip of solvent liquid nozzle 1112 is bent to supply the solvent liquid on the circular arc passing the center of rotation of wafer W when motor 1078 is driven.

Pressure reducing means 1190 has a pump 1184 for exhausting atmosphere in sealed chamber 1165.

Pressure normalizing means 1140 has means for supplying an inert gas (nitrogen gas in this case) into sealed chamber 1165 and has an N2 source 1199 for sending nitrogen gas, a gas pipe 1198 for communicating N2 source 1199 and sealed chamber 1165, and a gas valve 1193 provided for gas pipe 1198, for opening/closing the passage of gas pipe 1198.

In the substrate processing apparatus of the preferred embodiment, substrate holding means 1061 holds wafer W in sealed chamber 1165 in which the pressure is reduced.

2-2-2 Substrate Processing Method

A substrate processing method using the substrate processing apparatus of the third preferred embodiment will now be described. Since the transportation of wafer W from loading/unloading section 1003 to rotary processing unit 1151 is similar to that in the substrate processing method of the second preferred embodiment, its description will not be repeated here. Processes in rotary processing unit 1151 will be described.

In rotary processing unit 1151 which has received wafer W, wafer W is held by substrate holding means 1061, and the sealing shutter is closed to assure the air tightness in sealed chamber 1165. Drain valve 1072 is opened.

Subsequently, substrate holding means 1061 rotates motor 1066 to rotate wafer W.

When wafer W reaches a predetermined rotational speed, the removal liquid supplying process is executed. In the removal liquid supplying process, motor 1073 is driven to move removal liquid nozzle 1075 in the standby position to the discharge position. Removal liquid valve 1077 is opened to supply the removal liquid from removal liquid nozzle 1075 to wafer W. The removal liquid supplied to wafer W is dropped outside of wafer W, collected by cup 1062, and discharged via drain pipe 1069 to drain 1070. After supplying the removal liquid for predetermined time, removal liquid nozzle 1075 is returned to the standby position.

Since the removal liquid supplied to wafer W acts on the reaction product on the substrate in the removal liquid supplying process, the reaction product on the substrate comes to be easily dropped from the substrate. Consequently, the reaction product is gradually removed from wafer W by the rotation of wafer W and supply of the removal liquid.

Subsequently, the de-ionized water supplying process is executed. In the de-ionized water supplying process, motor 1078 is driven to move de-ionized water nozzle 1081 in the standby position to the discharge position. De-ionized water valve 1083 is opened to supply de-ionized water from de-ionized water nozzle 1081 to wafer W. The de-ionized water supplied to wafer W is dropped out of wafer W, collected by cup 1062, and drained via drain pipe 1069 to drain 1070. After supplying the de-ionized water for predetermined time, de-ionized water valve 1083 is closed and de-ionized water nozzle 1081 is returned to the standby position.

In the de-ionized water supplying process, the de-ionized water supplied to wafer W washes out a contaminant such as the removal liquid and the reaction product from wafer W.

Subsequently, the draining process is executed. In the draining process, by rotating wafer W at high speed, the liquid on wafer W is drained and discharged to drain 1070, and wafer W is almost dried.

Subsequently, a drying process is executed. First, the temperature adjusting process for heating wafer W by temperature adjusting means 1187 is performed. In this case, substrate is heated to a temperature in a range from 30 degrees to 40 degrees in consideration that IPA is used as an organic solvent.

After that, pump 1184 is driven to exhaust the atmosphere in sealed chamber 1165.

Simultaneously with the driving of pump 1184, gas valve 1193 is opened to introduce nitrogen gas into sealed chamber 1165. By the operations, the substitution process of substituting the atmosphere in sealed chamber 1165 with nitrogen atmosphere is executed.

While continuing the driving of pump 1184, drain valve 1072 and gas valve 1193 are closed to stop the supply of nitrogen gas into sealed chamber 1165, thereby reducing the pressure in sealed chamber 1165. In such a manner, the pressure reducing process of decreasing the atmospheric pressure in sealed chamber 1165 to be lower than the normal pressure (101325 Pa) is executed. In this case, the pressure in sealed chamber 1165 is set to 666.5 Pa to 6665 Pa, preferably, 666.5 Pa to 2666 Pa.

After gas valve 1093 is closed, while continuing the driving of pump 1184, motor 1078 is driven to move solvent liquid nozzle 1112 to the discharge position and solvent liquid valve 1113 is opened. In such a manner, the solvent supplying process for supplying an organic solvent from solvent liquid nozzle 1112 to wafer W is executed. After opening solvent liquid valve 1113 for predetermined time, solvent liquid valve 1113 is closed.

After closing solvent liquid valve 1113, while continuing the driving of pump 1184, gas valve 1193 is opened again. In such a manner, the pressure normalizing process for normalizing the pressure in sealed chamber 1165 is executed.

After elapse of predetermined time, in a state where gas valve 1193 is open, the driving of pump 1184 is stopped. After that, gas valve 1193 is closed and the drying process is finished.

Since wafer W is heated in the temperature adjusting process, the water content remained on wafer W easily evaporates. Moreover, the atmospheric pressure around wafer W is reduced in the pressure reducing process. Consequently, the boiling point of the liquid decreases, and the de-ionized water remained on wafer W easily evaporates.

Further, the organic solvent is supplied to wafer W during the pressure reducing process. Consequently, the organic solvent is mixed with the water content remained on wafer W. Since the boiling point of the mixture of water and the organic solvent is lower than that of water, the mixture easily evaporates from wafer W and the water content can be taken from wafer W. Moreover, since wafer W is heated in the temperature adjusting process and the atmospheric pressure around wafer W is decreased in the pressure reducing process, the mixture of water and the organic solvent easily evaporates in short time. Therefore, wafer W can be dried extremely certainly.

The drying process can be also executed by the pressure reducing process and the pressure normalizing process. In this case, by the drop in atmospheric pressure around wafer W, the boiling point of the water content remained on wafer W decreases, and the water content easily evaporates. Thus, the drying operation can be easily executed.

The drying process can be executed by the pressure reducing process, the solvent supplying process, and the pressure normalizing process. In this case, although the mixture of water on the substrate and the organic solvent is generated, since the boiling point of the mixture is lower than that of water, the mixture easily evaporates. Moreover, the boiling point of the mixture is reduced by the decrease in atmospheric pressure around wafer W, the water content can be evaporated in shorter time with reliability.

The drying process can be also executed by the pressure reducing process, the temperature adjusting process, and the pressure normalizing process. In this case, since the water content on the substrate is heated in the temperature adjusting process and the atmospheric pressure around wafer W is decreased, the water content evaporates in short time with reliability.

The drying process can be executed only by the solvent supplying process. In this case, although the mixture of water on the substrate and the organic solvent is generated, since the boiling temperature of the mixture is lower than that of water, the mixture easily evaporates. Thus, wafer W can be dried in short time with reliability.

The drying process is executed by the temperature adjusting process and the solvent supplying process. In this case, although the mixture of water on the substrate and the organic solvent is generated, since the boiling point of the mixture is lower than that of water, the mixture easily evaporates. Moreover, since the mixture is heated in the temperature adjusting process, the mixture easily reaches the boiling point and evaporates. Thus, wafer W can be dried with reliability in short time.

In the drying process, wafer W may be in a stopped state but is preferably rotated.

The draining process may be omitted and the drying process is executed immediately after the de-ionized water supplying process. In this case, it is preferable to rotate wafer W during the drying process because the drying process can be performed while draining the de-ionized water.

Although the solvent supplying process is carried out by using solvent liquid supplying means 1110 in the preferred embodiment, it can be executed by the following solvent steam supplying means 1180.

Solvent steam supplying means 1180 has a solvent steam supplying nozzle 1192 provided over the center of rotation of wafer W, a solvent steam source 1195 for sending the solvent steam to solvent steam supplying nozzle 1192, and a solvent steam valve 1194 provided for a solvent steam duct 1197 between solvent steam source 1195 and solvent steam supplying nozzle 1192. The solvent steam in this case includes a fog-state organic solvent constructed by fine droplets and a vapor organic solvent. Consequently, solvent steam source 1195 includes, as solvent steam generating means, ultrasonic vaporizing means for applying an ultrasonic wave to the liquid IPA to obtain solvent steam, heating vaporizing means for heating the liquid IPA to obtain solvent steam, and bubbling vaporizing means for supplying bubbles of inert gas such as nitrogen to the liquid IPA to obtain solvent steam.

When the solvent supplying process is executed, solvent steam valve 1194 is opened to supply the solvent steam from solvent steam nozzle 1192 into sealed chamber 1165. With respect to solvent steam supplying means 1180 and solvent liquid supplying means 1110, both of them may be provided or one of them may be provided.

Wafer W on which the drying process has been completed is carried out by first substrate transporting mechanism 1053 and placed on first delivery stand 1039. Wafer W placed on first delivery stand 1039 is loaded in carrier C placed on unloading unit 1033 by loading/unloading mechanism 1037.

Figure 14:
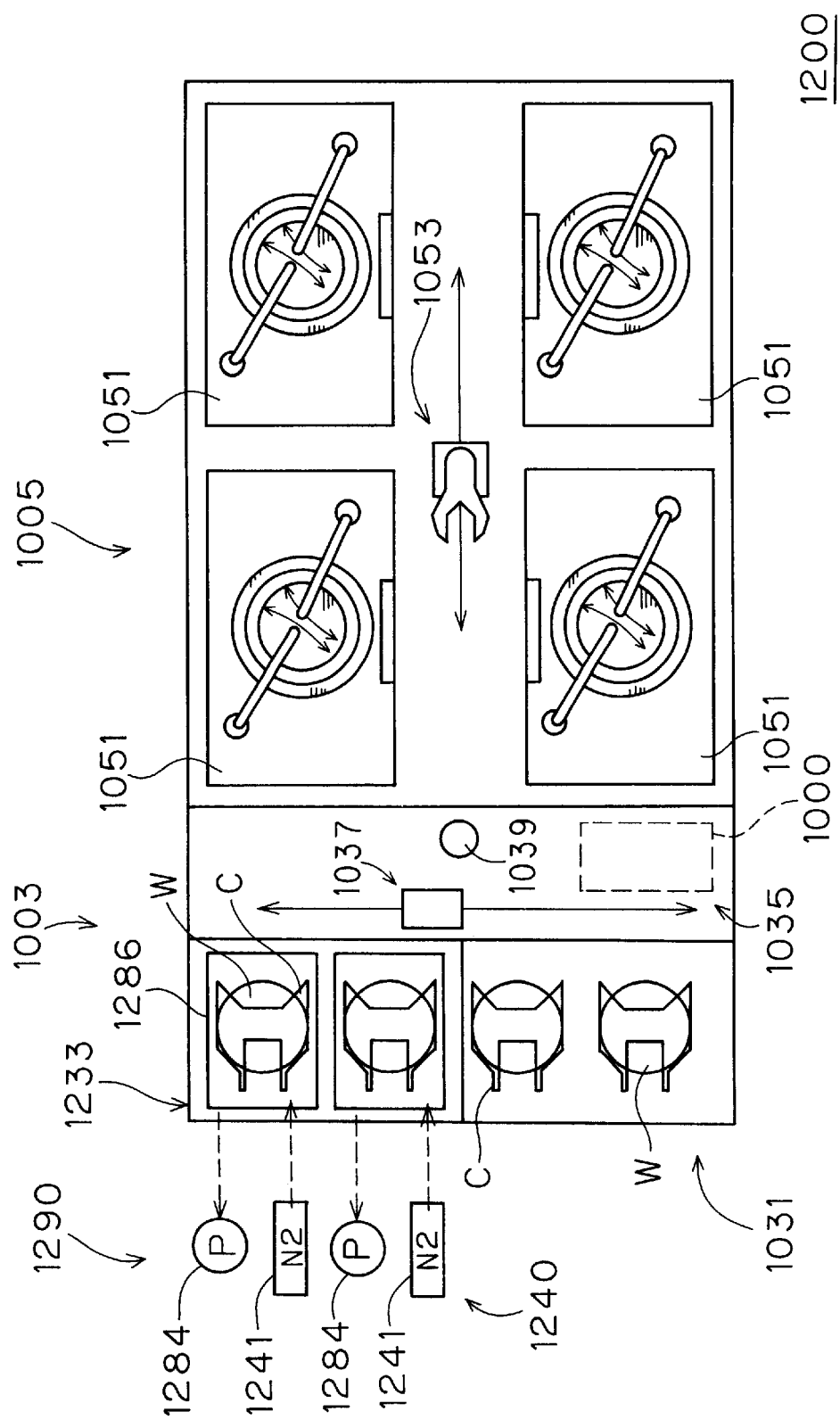
FIG. 14 is a top view of a substrate processing apparatus.

2-3 Fourth Embodiment 2-3-1 Substrate Processing Apparatus and Substrate Processing Method FIG. 14 is a top view of a substrate processing apparatus 1200.

Substrate processing apparatus 1200 according to a fourth preferred embodiment is similar to substrate processing apparatus 1001 of the second preferred embodiment except that interface 1007 and drying section 1009 are omitted and the configuration of unloading unit 1033 is changed.

Substrate processing apparatus 1200 is provided with a unloading chamber 1286 for surrounding carriers C in which processed substrates W are housed in a state where air tightness is assured. To unloading chamber 1286, as pressure normalizing means 1240, an inert gas supplying means 1241 is connected and also pressure reducing means 1290 having a pump 1284 is connected.

In substrate processing apparatus 1200, wafer W subjected to the removal liquid supplying process, de-ionized water supplying process, and draining process in the rotary processing unit 1051 is housed in carrier C in unloading chamber 1286. After that, while exhausting the atmosphere in unloading chamber 1286 by pressure reducing means 1290, nitrogen gas as inert gas is supplied into unloading chamber 1286 by inert gas supplying means 1241. In such a manner, the substituting process for substituting the air in unloading chamber 1286 with the nitrogen atmosphere is executed.

After that, when the supply of nitrogen gas is stopped and exhausting of the atmosphere in unloading chamber 1286 is continued, the pressure in unloading chamber 1286 decreases, thereby executing the pressure reducing process. In the pressure reducing process, the atmospheric pressure in unloading chamber 1286 is set to be lower than the normal pressure (101325 Pa). In this case, the pressure is set to 666.5 Pa to 6665 Pa, preferably, 666.5 Pa to 2666 Pa.

Consequently, the water content remained on treated wafer W is evaporated, and the drying process can be performed with reliability. After housing the maximum number of processed substrates W in carriers C, the substituting process and the pressure reducing process may be performed. In a state where substrates W of the number smaller than the maximum housing number are housed in carriers C, the substituting process and the pressure reducing process may be executed.

Since the drying process is performed in unloading chamber 1286 surrounding the whole carrier C for housing a plurality of substrates W, as compared with the process of drying wafer W one by one, improved throughput can be achieved.

The loading/unloading of carrier C to/from unloading unit 1233 and the loading/unloading of wafer W to/from carrier C are performed by opening/closing a shutter (not shown) provided for unloading chamber 1286.

2-3-2 Modifications

It is also possible not to provide unloading chamber 1286 but to prepare a sealed container for housing wafer W or carrier C in which wafer W is housed. Wafer W or carrier C in which wafer W is housed is housed in the sealed container and is loaded/unloaded in loading/unloading section 1003 by the transporting mechanism on the outside of the apparatus. In the sealed container, means for connecting with inert gas supplying means 1241 and means for connecting with pressure reducing means 1290 are provided. When placed on unloading unit 1233, each of inert gas supplying means 1241 and pressure reducing means 1290 is connected to the sealed container. With the configuration, the atmosphere in the sealed container can be substituted with inert gas or exhausted to reduce the reduction in pressure.

In a face opposite to loading/unloading mechanism 1037 of the sealed container, a shutter for passing wafer W at the time of loading/unloading is provided. With the configuration, in a manner similar to unloading chamber 1286, substitution with nitrogen atmosphere and decrease in pressure in the sealed container can be performed. The water content remained on processed wafer W evaporates, and the drying process can be obtained with reliability.

2-4 Modifications of Second to Fourth Preferred Embodiments

Unloading unit 1033 of substrate processing apparatus 1001 of the second preferred embodiment having interface 1007 and drying unit 1009 may be changed as unloading unit 1233. The unloading unit of the substrate processing apparatus of the third preferred embodiment may be changed as unloading unit 1233.

In the substrate processing apparatus, particularly, in the case of processing a wafer having a rough pattern on its surface as a target, an effect is produced for the reason that the water content remained in the rough pattern is not easily removed only by the draining process.

In the case of processing a substrate having an insulating film in the substrate processing apparatus of the invention, it is particularly effective for the following reason. When the water content remains in the insulating film, the insulating performance becomes lower and the quality of the wafer deteriorates. However, it can be prevented.

In the case of processing a substrate having a porous film, the invention is particularly effective since water content tends to remain in the porous film. By using a substrate processing apparatus having de-ionized water supplying means for supplying de-ionized water to a substrate having a porous film, a chamber for housing the substrate, and pressure reducing means for reducing the pressure in the chamber, the substrate having the porous film can be dried with reliability.

In the case of processing a substrate having an insulating film which is porous, that is, a porous insulating film, the invention produces an extremely remarkable effect.

The position in the substrate to which the removal liquid and de-ionized water are supplied may not be specified. Consequently, for example, a substrate processing apparatus including a substrate holding means for holding a substrate, a removal liquid supplying means for supplying a removal liquid for removing a reaction product existing on the substrate, to the substrate held by the substrate holding means, de-ionized water supplying means for supplying de-ionized water to the substrate held by the substrate holding means, a chamber for housing the substrate to which the de-ionized water is supplied, and pressure reducing means for reducing the pressure in the chamber may be realized. In this case, solvent liquid supplying means for supplying a liquid organic solvent to the substrate in the chamber may be also provided. Temperature adjusting means for adjusting the temperature of the substrate in the chamber may be also provided. The substrate in this case may be a substrate subjected to dry etching using a resist film as a mask, and the removal liquid may be a liquid for removing a reaction product generated by the dry etching.

3. Supplemental Remarks of the Embodiments

Although each of the foregoing preferred embodiments has disclosed that a polymer generated at the time of dry etching is removed from the substrate subjected to dry etching, the invention is not limited to removal of a polymer from a substrate on which the polymer is generated at the time of the dry etching.

For example, as described above, the invention includes the case of removing the polymer generated at the time of plasma ashing. Therefore, the invention includes the case of removing a polymer generated from a resist from a substrate in various processes which are not always the dry etching.

The invention is not limited to the removal of only the polymer generated by dry etching or plasma ashing but includes a case of removing various reaction products derived from a resist.

For example, there is a process of introducing a dopant into a thin film that is an underlayer of a resist film by using the resist film as a mask. Such a dopant introducing process includes a thermal diffusion process in which a substrate is provided in an atmosphere of a predetermined temperature and a gas including a dopnat is introduced, and an ion implantation process in which an accelerated ion such as boron (B), phosphorous (P) or arsenic (As) is ejected toward a substrate.

In both the thermal diffusion process and the ion implantation process, a dopant is introduced into a thin film in an exposed portion that is not masked by a resist film. In a substrate subjected to such a process, an ion is incorporated into not only a thin film existing in the lower part of the resist film but the resist film.

For this reason, a part or the whole of the resist converts, thereby generating "a reaction product generated by conversion of a resist" as is described in the invention. Such a reaction product is an organic matter derived from a resist and is an object to be removed in the invention.

The invention is not limited to the removal of a reaction product derived from a resist from a substrate but includes a case of removing a resist itself from a substrate.

For example, a case such that a resist is coated, a pattern such as a wiring pattern is exposed in the resist, the resist is developed, a process on an underlayer of the resist is finished, and the resist film which becomes unnecessary is removed is also included.

In this case, simultaneously with removal of an unnecessary resist film, if there is a reaction product generated by conversion of the resist film, it can be also removed. Thus, the throughput is improved and the cost can be reduced. For example, in the underlayer process, in the case of performing dry etching on a thin film as an underlayer, the reaction product is also generated. Thus, the resist film itself provided to mask the underlayer at the time of dry etching and the reaction product generated by conversion of the resist film can be simultaneously removed.

In a case of exerting a dopant introducing process (especially an ion implantation process in which ions are introduced at a high energy) on a thin film that is an underlayer, a reaction product derived from a resist is generated. Thus, the resist film itself provided to mask the underlayer at the time of dopant introducing process and the reaction product generated by conversion of the resist film can be simultaneously removed.

The invention is not limited to removal of a reaction product derived from a resist and the resist itself from the substrate but includes the case of removing an organic matter which is not derived from a resist, for example, a fine contaminant generated from a human body from the substrate.

While the invention has been shown and described in detail, the foregoing description is in all aspects illustrative and not restrictive. It is therefore understood that numerous other modifications and variations can be devised without departing from the scope of the invention.

What is claimed is:

1. A substrate processing apparatus for removing an organic matter adhered to a substrate by a removal liquid of the organic matter, comprising:

a rotary holding unit for holding the substrate so as to be rotatable;

a removal liquid supplying mechanism for supplying said removal liquid toward a surface of the substrate held by said rotary holding unit;

a de-ionized water supplying mechanism for supplying de-ionized water toward the surface of the substrate held by said rotary holding unit; and a heating unit comprising a heating plate for heating the entire substrate with the substrate placed thereon.

2. The substrate processing apparatus according to claim 1, wherein after the removal liquid is supplied to the substrate by said removal liquid supplying mechanism and de-ionized water is supplied to the substrate by said de-ionized water supplying mechanism, said heating unit heats the substrate.

3. The substrate processing apparatus according to claim 1, wherein said heating unit heats the substrate before the removal liquid is supplied to the substrate by said removal liquid supplying mechanism.

4. The substrate processing apparatus according to claim 3, wherein said heating unit also heats the substrate to which the removal liquid has been supplied by said removal liquid supplying mechanism and to which de-ionized water has been supplied by said de-ionized water supplying mechanism.

5. The substrate processing apparatus according to claim 4, further comprising a cooling unit for cooling the heated substrate after de-ionized water is supplied by said de-ionized water supplying mechanism.

6. The substrate processing apparatus according to claim 5, wherein said removal liquid supplying mechanism supplies a heated removal liquid to the substrate.

7. The substrate processing apparatus according to claim 6, wherein said heating unit heats the substrate to a temperature of the removal liquid or higher before the removal liquid is supplied to the substrate by said removal liquid supplying mechanism.

8. The substrate processing apparatus according to claim 7, wherein said organic matter adhered to the substrate is a reaction product generated by conversion of a resist film formed on the substrate.

9. The substrate processing apparatus according to claim 8, wherein said reaction product is a polymer generated by dry etching a thin film existing on the surface of the substrate by using said resist film as a mask.

10. A substrate processing apparatus for removing an organic matter adhered to a substrate by a removal liquid of the organic matter, comprising:

an indexer for loading the substrate;

a spin processing unit comprising a rotary holding unit for holding the substrate so as to be rotatable, a removal liquid supplying mechanism for supplying said removal liquid toward a surface of the substrate held by said rotary holding unit, and a de-ionized water supplying mechanism for supplying de-ionized water toward the surface of the substrate held by said rotary holding unit;

a heating unit comprising a heating plate for heating the entire substrate with the substrate placed thereon; and a transporting unit for transporting the substrate among said indexer, said spin processing unit, and said heating unit.

11. The substrate processing apparatus according to claim 10, wherein after a removal liquid is supplied by said removal liquid supplying mechanism and de-ionized water is supplied by said de-ionized water supplying mechanism, said heating unit heats the substrate transported by said transporting unit from said spin processing unit to said heating unit.

12. The substrate processing apparatus according to claim 10, wherein said heating unit heats the substrate transported by said transporting unit from said indexer to said heating unit before the removal liquid is supplied to the substrate by said removal liquid supplying mechanism.

13. The substrate processing apparatus according to claim 12, wherein after the removal liquid is supplied by said removal liquid supplying mechanism and de-ionized water is supplied by said de-ionized water supplying mechanism, said heating unit also heats the substrate transported by said transporting unit from said spin processing unit to said heating unit.

14. The substrate processing apparatus according to claim 13, further comprising a cooling unit for cooling the substrate heated after de-ionized water is supplied by said de-ionized water supplying mechanism.

15. The substrate processing apparatus according to claim 14, wherein said removal liquid supplying mechanism supplies a heated removal liquid to the substrate.

16. The substrate processing apparatus according to claim 15, wherein said heating unit heats the substrate to a temperature of the removal liquid or higher before the removal liquid is supplied to the substrate by said removal liquid supplying mechanism.

17. The substrate processing apparatus according to claim 16, wherein said organic matter adhered to the substrate is a reaction product generated by conversion of a resist film formed on the substrate.

18. The substrate processing apparatus according to claim 17, wherein said reaction product is a polymer generated by dry etching a thin film existing on the surface of the substrate by using said resist film as a mask.

19. A substrate processing apparatus for removing an organic matter adhered to a substrate by a removal liquid of the organic matter, comprising:

a substrate holding unit for holding the substrate;

a removal liquid supplying mechanism for supplying said removal liquid toward the substrate held by said substrate holding unit;

a de-ionized water supplying mechanism for supplying de-ionized water toward the substrate held by said substrate holding unit;

a chamber for housing the substrate held by said substrate holding unit; and a pressure reducing unit for reducing pressure in said chamber.

20. The substrate processing apparatus according to claim 19, further comprising a solvent liquid supplying unit for supplying a liquid organic solvent to the substrate.

21. The substrate processing apparatus according to claim 19, further comprising a solvent steam supplying unit for supplying a fog-state or vapor organic solvent into said chamber.

22. The substrate processing apparatus according to claim 21, further comprising a temperature adjusting unit for adjusting temperature of the substrate in said chamber.

23. The substrate processing apparatus according to claim 22, wherein said organic matter adhered to the substrate is a reaction product generated by conversion of a resist film formed on the substrate.

24. The substrate processing apparatus according to claim 23, wherein said reaction product is a polymer generated by dry etching a thin film existing on the surface of the substrate by using said resist film as a mask.

25. A substrate processing apparatus for removing an organic matter adhered to a substrate by a removal liquid of the organic matter, comprising:

a substrate holding unit for holding the substrate;

a removal liquid supplying mechanism for supplying said removal liquid toward the substrate held by said substrate holding unit;

a de-ionized water supplying mechanism for supplying de-ionized water toward the substrate held by said substrate holding unit;

a chamber for housing the substrate;

a transporting unit for transporting the substrate held by said substrate holding unit to said chamber; and a pressure reducing unit for reducing pressure in said chamber.

26. The substrate processing apparatus according to claim 25, further comprising a solvent liquid supplying unit for supplying a liquid organic solvent to the substrate.

27. The substrate processing apparatus according to claim 25, further comprising a solvent steam supplying unit for supplying a fog-state or vapor organic solvent into said chamber.

28. The substrate processing apparatus according to claim 27, further comprising a temperature adjusting unit for adjusting temperature of the substrate in said chamber.

29. The substrate processing apparatus according to claim 28, wherein said organic matter adhered to the substrate is a reaction product generated by conversion of a resist film formed on the substrate.

30. The substrate processing apparatus according to claim 29, wherein said reaction product is a polymer generated by dry etching a thin film existing on the surface of the substrate by using said resist film as a mask.

31. A substrate processing apparatus for removing an organic matter adhered to a substrate by a removal liquid of the organic matter, comprising:

a loading unit on which an unprocessed substrate is placed;

a removal liquid supplying mechanism for supplying said removal liquid toward the unprocessed substrate;

a de-ionized water supplying mechanism for supplying de-ionized water toward the substrate processed by using said removal liquid supplying mechanism;

an unloading unit on which the substrate processed by using said de-ionized water supplying mechanism is placed;

an unloading chamber provided for said unloading unit, for housing the substrate; and a pressure reducing unit for reducing pressure in said unloading chamber.

32. The substrate processing apparatus according to claim 31, wherein said organic matter adhered to the substrate is a reaction product generated by conversion of a resist film formed on the substrate.

33. The substrate processing apparatus according to claim 32, wherein said reaction product is a polymer generated by dry-etching a thin film existing on the surface of the substrate by using said resist film as a mask.

* * * * *